United States Patent
Jin

(10) Patent No.: US 6,928,007 B2
(45) Date of Patent: Aug. 9, 2005

(54) ODT MODE CONVERSION CIRCUIT AND METHOD

(75) Inventor: Seung-Eon Jin, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/837,295

(22) Filed: Apr. 29, 2004

(65) Prior Publication Data

US 2004/0240298 A1 Dec. 2, 2004

(30) Foreign Application Priority Data

Apr. 29, 2003 (KR) ................................ 10-2003-0026938

(51) Int. Cl.⁷ ................................................. G11C 7/00
(52) U.S. Cl. ........................ 365/194; 365/226; 365/191
(58) Field of Search ................................ 365/194, 226, 365/191, 230.06, 189.05, 229

(56) References Cited

U.S. PATENT DOCUMENTS

| | | | |
|---|---|---|---|
| 5,917,759 A | 6/1999 | Akashi | |
| 6,005,412 A | 12/1999 | Ranjan et al. | |
| 6,020,761 A | 2/2000 | Hwang et al. | |
| 6,031,782 A | 2/2000 | Kobashi et al. | |
| 6,064,226 A | 5/2000 | Earl | |
| 6,087,851 A | 7/2000 | Kim et al. | |
| 6,339,552 B1 | 1/2002 | Taruishi et al. | |
| 6,424,590 B1 | 7/2002 | Taruishi et al. | |
| 6,510,099 B1 | 1/2003 | Wilcox et al. | |
| 6,510,100 B2 | 1/2003 | Grundon et al. | |
| 6,525,988 B2 * | 2/2003 | Ryu et al. | 365/233 |
| 6,650,594 B1 * | 11/2003 | Lee et al. | 365/233 |
| 2001/0050578 A1 | 12/2001 | Yamamoto | |
| 2002/0054516 A1 | 5/2002 | Taruishi et al. | |
| 2002/0163846 A1 | 11/2002 | Taruishi et al. | |

FOREIGN PATENT DOCUMENTS

| | | |
|---|---|---|
| JP | 10-173512 | 6/1998 |
| JP | 11-066862 | 3/1999 |
| JP | 11-120773 | 4/1999 |
| JP | 11-134864 | 5/1999 |
| JP | 11-203866 | 7/1999 |
| JP | 2001-067877 | 3/2001 |

* cited by examiner

Primary Examiner—Anh Phung
Assistant Examiner—Dang T. Nguyen
(74) Attorney, Agent, or Firm—Blakely Sokoloff Taylor & Zafman

(57) ABSTRACT

There is provided a semiconductor device using an ODT technology, which is capable of minimizing a delay of an RTT formation timing or a misalignment of RTT with respect to clock, which may occur in a conversion of ODT signal before and after a conversion of a power down mode into an active/standby mode. An ODT mode conversion circuit includes: a clock enable control unit for receiving a precharge signal including an information on a presence of a bank access in a semiconductor memory device, detecting whether the semiconductor memory device exits a precharge power down mode or an active power down mode, and outputting a mode classification signal, in which the mode classification signal has different logic levels depending on the precharge power down exit and the active power down exit; an ODT control unit configured to operate in a power down mode or an active/standby mode according to the mode classification signal; and an RTT formation unit for forming an RTT according to an RTT formation control signal that is outputted from the ODT control unit.

28 Claims, 17 Drawing Sheets

US 6,928,007 B2

ODT MODE CONVERSION CIRCUIT AND METHOD

FIELD OF THE INVENTION

The present invention relates to an ODT technology; and, more particularly, to an ODT technology that is capable of properly operating an ODT circuit by shifting a mode conversion until an output clock signal of a DLL is stabilized after a power down exit, in case when a semiconductor memory device converts an operation mode from a power down mode to an active/standby mode.

DESCRIPTION OF RELATED ART

On Die Termination (ODT) technology is introduced to improve signal integrity by minimizing signal reflection in an interface between system and memory, which are based on stub series termination logic (SSTL) II. Due to the introduction of the ODT technology, a termination voltage (VTT) can be provided by dynamic random access memory (DRAM) and memory controller in DDR-II SDRAM, instead of a motherboard.

The termination technology will now be described in detail.

It is assumed that there are two ranks on a memory module. When the memory controller reads out data from DRAM of a first rank, the memory controller applies an ODT signal of a logic high level to DRAM of a second rank. At this time, the DRAM of the second rank forms a termination on data bus, which is shared with the first rank. This is called "termination resistor (RTT) formation.

Meanwhile, after the DRAM exits a precharge power down mode, a predetermined time is required to regenerate an output clock signal of a delay locked loop (DLL) circuit, which does not operate during a power down mode. In other words, even if the DRAM exits a power down mode, there is no output clock signal of the DLL circuit during a predetermined period. In order to properly process the ODT signal, which is applied from an external circuit, an ODT control circuit should convert an operation mode from the power down mode to an active/standby mode after the DLL clock signal is outputted.

However, during the precharge power down period, the DLL circuit does not operate while maintaining a locking state before it enters the power down mode. Thus, there is almost no power consumption. In this state, a re-operation of the DLL circuit due to the power down exit causes an unstable state of a power supplied to the DLL circuit for a long time. Also, an output clock signal of the DLL circuit is unstable until the power is stabilized. Accordingly, it is difficult to properly adjust a timing for forming the RTT in response to the ODT signal.

FIG. 1 is a timing diagram showing an operation of the ODT in the active/standby mode according to the prior art, and FIG. 2 is a timing diagram showing an operation of the ODT in the power down mode according to the prior art.

Referring to FIGS. 1 and 2, whether DRAM is in the active/standby state or the power down state is determined depending on a starting point of the RTT formation generated in response to the ODT signal. The reason having a different starting point of the RTT formation is because the DLL circuit does not output the clock signal in the power down mode.

In the active/standby mode, the ODT circuit provides the ODT signal, which changes from a logic low level to a logic high level in synchronization with a rising edge or a falling edge of the clock signal outputted from the DLL circuit. Thereafter, an external data bus is terminated by the RTT formation in synchronization with a rising edge of an external clock signal after a delay time as much as two clock cycles (T3). This delay time is called an ODT turn-on delay time (TAOND).

When the ODT circuit provides the ODT signal, which changes from a logic high level to a logic low level, the RTT becomes off in synchronization with a falling edge of the external clock signal after a delay time as much as 2.5 clock cycles. This delay time is called an ODT turn-off delay time (TAOFD).

Meanwhile, there are two kinds of the power down mode in the DRAM.

When a clock enable signal (CKE) of a logic low level is applied and thus the DRAM enters the power down mode, if a certain signal for performing a read operation or a write operation is accessed to any one of banks in the DRAM, the DRAM enters the power down mode from an active mode. This is called an active power down mode.

On the other hand, if there is no signal access to the any bank of the DRAM, the DRAM enters the power down mode from the precharge mode. This is called a precharge power down mode.

In the active power down mode, a command buffer and an address buffer are disabled, an output clock tree of the DLL circuit is gated off, and most output signals of the clock buffer used in a peripheral circuit are gated off. The output clock tree of the DLL circuit will be described later. At this time, internal circuits do not accept external commands any more.

In the precharge power down mode, even clock signals inputted to a delay unit of the DLL circuit are gated off in order to reduce power consumption of the DRAM, and the DLL circuit does not operated and just maintains a previous locking information.

Accordingly, in the power down mode, the output signal of the DLL circuit, which is necessary for forming the RTT in the DRAM, cannot be used. Therefore, there is required that the minimum value and the maximum value of a power down turn-on time TAONPD and a power down turn-off time TAOFPD have to secure larger margin than that of the ODT turn-on delay time TAOND and the ODT turn-off delay time TAOFD.

FIG. 3 is a block diagram showing a conventional ODT operation.

As shown, an ODT operation unit 100 includes a clock enable buffer 110, a clock buffer 120, an ODT buffer 130, a DLL circuit 140, an ODT control unit 150, a RTT formation unit 160, and a data output buffer 170.

The clock enable buffer 110 receives a clock enable signal CLKE and outputs a buffered clock enable signal ICKE, and the clock buffer 120 receives an external clock signal CLK and an external clock bar signal CLKB and outputs an ODT control clock signal CLKODT for controlling the ODT control unit 150. The ODT buffer 130 compares an ODT signal ODT with a reference voltage and outputs an ODT comparison signal ODTI, and the DLL circuit 140 outputs a rising clock signal RCLK and a falling clock signal FCLK using the external clock signal CLK and the external clock bar signal CLKB. The ODT control unit 150 receives the buffered clock enable signal ICKE, the ODT control signal CLKODT, the ODT comparison signal ODTI, the rising clock signal RCLK and the falling clock signal FCLK and outputs an RTT formation control signal ODTF. The RTT formation unit 160 turns on/off the RTT in response to the RTT formation control signal outputted from the ODT control unit 150, and the data output buffer 170 provides data on a data bus through a combination with an output signal of the RTT formation unit 160.

The DLL circuit 140 includes a DLL clock buffer 141, a DLL delay unit 143 and a DLL clock generator 145. The DLL clock buffer 141 receives the external clock signal CLK, the external clock bar signal CLKB and the buffered clock enable signal ICKE and outputs a buffered clock signal ICLK, and the DLL delay unit 143 delays the buffered clock signal ICLK and outputs a delayed clock signal DCLK and a delayed clock bar signal DCLKB. The DLL clock generator 145 logically combines the delayed clock DCLK, the delayed clock bar signal DCLKB and the buffered clock enable signal ICKE and outputs the rising clock signal RCLK and the falling clock signal FCLK, which are internal clock signals, each of which has desired pulse width.

FIG. 4 is a circuit diagram of the DLL clock buffer 141 in FIG. 3.

Referring to FIG. 4, the DLL clock buffer 141 includes a DLL clock buffer unit 410 and a DLL clock buffer output control unit 430. The DLL clock buffer unit 410 buffers the external clock signal CLK and the external clock bar signal CLKB in response to an enable signal EN. The DLL clock buffer output control unit 430 logically combines an output signal IOUT of the DLL clock buffer unit 410, a precharge signal PRE and the buffered clock enable signal ICKE and outputs the buffered clock signal ICLK, so that the output signal IOUT of the DLL clock buffer unit 410 cannot be inputted to the DLL delay unit 143 in the precharge power down mode.

The DLL circuit 140 adjusts the delay time of the buffered clock signal ICLK in the DLL delay unit 143 and locks the rising clock signal RCLK and the falling clock signal FCLK with the external clock signals CLK and CLKB. In other words, the rising clock signal RCLK is a leading signal as much as a predetermined time tDQ with respect to the rising edge of the external clock signal CLK and the falling clock signal FCLK is a lagging signal as much as the predetermined time tDQ with respect to the falling edge of the external clock signal CLK. Here, the predetermined time tDQ is a time that is taken to output data from the rising edges of the rising clock signal RCLK and the falling clock signal FCLK to the data output. Therefore, the rising clock signal RCLK and the falling clock signal FCLK are employed to match a variation time of the data output with the rising and falling edges of the external clock signal CLK.

FIG. 5 is a circuit diagram of the DLL clock generator 145 in FIG. 3.

Referring to FIG. 5, the DLL clock generator 145 logically combines the delayed clock signal DCLK and the delayed clock bar signal DCLKB, which are inputted from the DLL delay unit 143, with the buffered clock enable signal ICKE and outputs the rising clock signal RCLK and the falling clock signal FCLK as the internal clock signals having desired pulse width.

Since the buffered clock enable signal ICKE is always in a logic low level in the active power down mode and the precharge power down mode, the rising clock signal RCLK and the falling clock signal FCLK also become logic low levels. It is said that the output clock tree becomes off.

Since the clock enable buffer 110, the clock buffer 120 and the ODT buffer 130 are well known to those skilled in the art, their detailed descriptions will be omitted.

The clock enable buffer 110 compares the clock enable signal CKE with a reference voltage VREF and outputs the buffered clock enable signal ICKE, which is synchronized with the rising edge of the external clock signal CLK. The reason why the buffered clock enable signal ICKE is synchronized with the rising edge of the external clock signal CLK is that data input/output has to operate in synchronization with the external clock CLK. Meanwhile, the clock enable buffer 110 may further include a synchronization circuit.

The clock buffer 120 receives the external clock signal CLK and the external clock bar signal CLKB and outputs the ODT control clock signal CLKODT. Various kinds of buffer, for example, a differential type buffer, can be applied to the clock buffer.

The ODT buffer 130 compares the ODT signal ODT and the reference voltage VREF and outputs the ODT comparison signal ODTI.

The ODT control unit 150 receives the buffered clock enable signal ICKE, the ODT control clock signal CLKODT, the ODT comparison signal ODTI, the rising clock signal RCLK and the falling clock signal FCLK and outputs the RTT formation control signal ODTF. The ODT control unit 150 determines the delay time, that is, the time point when the RTT is on or off in response to the ODT signal.

FIG. 6 is a circuit diagram of the conventional ODT control unit 150. The ODT control unit 150 may be used in the present invention.

However, in order to use the ODT control unit of FIG. 6 in the present invention, an additional circuit for initializing first to sixth latches LATCH1 to LATCH6 is required. Since the additional circuit is well known to those skilled in the art, its detailed description will be omitted. Meanwhile, "NA", "NC" and "NE" in FIG. 6 have initial values of logic high level and "NB", "ND" and "NF" have initial values of logic low level. However, it is obvious to those skilled in the art that "NA", "NC", "NE", "NB", "ND" and "NF" can also have initial values of inverted logic level.

FIG. 7 is a circuit diagram of the conventional RTT formation unit 160.

If the RTT formation control signal ODTF that changes from a logic low level to a logic high level is inputted to the RTT formation unit 160, a PMOS transistor MP1 connected to a power supply voltage VDDQ and an NMOS transistor MN1 connected to a ground voltage VSSQ are turned on. Therefore, an output signal (data) DQ of the RTT formation unit 160 is terminated by division of resistors R1 and R2. Here, the resistor R1 is connected between the PMOS transistor MP1 and a center node and the resistor R2 is connected between the NMOS transistor MN1 and the center node. This is called "ODT turn on"

Meanwhile, if the RTT formation control signal ODTF that changes from a logic high level to a logic low level is inputted to the RTT formation unit 160, the PMOS transistor MP1 connected to the power supply voltage VDDQ and the NMOS transistor MN1 connected to the ground voltage VSSQ are turned off. Therefore, the turned-on termination becomes off. This is called "ODT turn off"

Generally, the output signals of the RTT formation unit 160 and the data output buffer 170 are commonly connected to form a data output (DQ) pin in the integrated circuit. In case of the semiconductor memory devices, it is usual that input signals of data input buffers are also connected commonly.

FIG. 8 is a timing diagram of an ODT control unit in an active/standby mode and a power down mode according to the prior art.

Referring to case (A) as shown in FIG. 8, there is described an operation of the conventional ODT control unit when the ODT signal is applied in the active/standby mode.

An operation of the ODT turn on in FIG. 6 will be described with reference to case (A). If the ODT signal ODT changes to a logic high level at T1, the RTT is formed at T3, that is, after two clock cycles from T1, with matching with the ODT turn-on delay time TAOND. In the internal operation of the ODT control unit 150, the first latch LATCH1 latches the ODT comparison signal ODTI at T1 in response to the rising of the ODT control clock signal CLKODT, and the second node NB changes to a logic high level through the second latch LATCH2. The output NC of the third latch LATCH3 changes to a logic low level at T1_ in response to a falling of the ODT control clock signal CLKODT. The output ND of the fourth latch LATCH4 changes to a logic high level at T2_ in response to a rising of the falling clock FCLK. Thereafter, the output NE of the fifth latch LATCH5 changes to a logic low level at T3 in response to the rising clock RCLK, and the RTT formation control signal ODTF of a logic high level is outputted through a NAND gate 631.

Meanwhile, most of DDR SDRAMs have different output times, which is taken from the rising clock signal RCLK or the falling clock signal FCLK to the data output driver, depending on PVT (process, voltage, temperature). However, the output time is generally in the range of 1.5 ns to 3 ns. Specifically, in some cases, the DDR-II SDRAM that operates at a clock frequency of 266 MHz or higher cannot satisfy RTT exit minimum time (TAONMIN) and RTT exit maximum time (TAONMAX), which are required by crossing clock domain from the ODT control clock signal CLKODT to the falling clock FCLK after T2. Accordingly, although the ODT control clock signal CLKODT controls the ODT comparison signal, the falling clock FCLK controls the ODT comparison signal at a time between T1_ and T2_. Such an operation is called "clock domain cross". Here, the RTT exit minimum time (TAONMIN) and the RTT exit maximum time (TAONMAX) indicate the deviation degree of the RTT before and after the clock edge. This can be seen in FIG. 1.

An operation of the ODT turn off in FIG. 6 will be described with reference to the case (A).

If the ODT signal ODT of a logic low level is applied at T3, the output NF of the sixth latch LATCH6 becomes a logic low level. The RTT formation control signal ODTF becomes a logic low level with matching with the ODT turn-on delay time TAOFD, thereby turning off the RTT at T5, that is, after 2.5 clock cycles. Since the other operations are similar to the ODT turn-on operation, their description will be omitted.

Referring to case (B) as shown in FIG. 8, there is described an operation of the conventional ODT control unit when the ODT signal ODT is applied in the power down mode.

In case of the power down mode, the buffered clock enable signal ICKE of a logic low level is outputted from the clock enable buffer 110. Therefore, the first ODT control signal generator 601 receives the ODT control clock signal CLKODT and outputs a clock delay signal CLKD of a logic low level and a clock delay bar signal CLKDB of a logic high level. The second ODT control signal generator 603 logically combines the buffered clock enable signal ICKE and the rising clock RCLK and outputs a rising clock delay signal RCLKD of a logic high level and a rising clock delay bar signal RCLKDB of a logic low level. The third ODT control signal generator 605 logically combines the buffered clock enable signal ICKE and the falling clock FCLK and outputs a falling clock delay signal FCLKD of a logic high level and a falling clock delay bar signal FCLKDB of a logic low level. Thus, the RTT formation control signal ODTF is asynchronously outputted 0.5-clock cycle after the ODT signal is applied. As a result, "0.5 clock+asynchronous delay time" is taken to form the RTT after the ODT signal is applied.

Of course, it is possible to configure the circuit to output the clock delay signal CLKD of a logic high level, the clock delay bar signal CLKDB of a logic low level, the rising clock delay signal RCLKD of a logic high level, the rising clock delay bar signal RCLKDB of a logic low level, the falling clock delay signal FCLKD of a logic high level, and the falling clock delay bar signal FCLKDB of a logic low level in response to the buffered clock enable signal ICKE. In this case, the ODT comparison signal ODTI is also outputted asynchronously as the RTT formation control signal ODTF.

FIG. 9 is a timing diagram illustrating the ODT turn on operation in case of the DRAM exits the precharge power down mode according to the prior art.

In a state that the ODT circuit satisfies a setup time (tIS) just before T−n, if the clock enable signal CKE changes to a logic low level and the precharge signal PRE changes to a logic high level, the DRAM can enter the precharge power down mode. Here, the precharge signal PRE of the logic high level represents that all banks are in the precharge mode. Thus, the buffered clock enable signal ICKE from the clock enable buffer 110 changes to a logic low level at T−n to Tn+1. As described above, the buffered clock enable signal ICKE operates in synchronization with the rising edge of the T−n clock signal CLK. Thereafter, the buffered clock signal ICLK, the rising clock signal RCLK and the falling clock signal FCLK change to logic low levels. Here, the buffered clock signal ICLK is the output signal of the DLL clock buffer 141 that is controlled by the buffered clock enable signal ICKE, and the rising clock signal RCLK and the falling clock signal FCLK are the output signals of the DLL clock generator 145.

In the precharge power down mode, since the buffered clock signal ICLK inputted to the DLL delay unit 143 is at a logic low level, the DLL circuit 140 does not perform the locking operation, but stores the previous locking information that is an information prior to the entrance into the power down mode. Since the DLL clock tree is in the off state, that is, the rising clock signal RCLK and the falling clock signal FCLK are at logic low levels, the power consumption in the peripheral circuits are minimized. Since the buffered clock enable signal ICKE is at a logic low level, the ODT control unit 150 cannot use the rising clock signal RCLK and the falling clock signal FCLK. Accordingly, the ODT control unit 150 outputs the RTT formation control signal ODTF "0.5 clock+asynchronous delay time" after the ODT signal is applied, and thus the RTT is formed.

An operation of the ODT control unit will now be described, in case when the DRAM exits the precharge power down mode.

If the clock enable signal CKE of a logic high level is applied just before T0, the buffered clock enable signal ICKE of a logic high level is outputted from the clock enable buffer 110. The buffered clock signal ICLK is inputted to the DLL delay unit 143 and the rising clock signal RCLK is generated after a first delay time td1. Here, the first delay time td1 includes the delay time of the DLL clock buffer 141, the asynchronous delay components of the DLL circuit 140, and the delay components of the delay unit of the DLL circuit used in the locking state prior to the power down. It can be seen that the rising of the clock CLK at T1 appears as the rising clock RCLK after the first delay time td1.

Meanwhile, as the clock enable signal CKE changes from a logic low level to a logic high level (before T0), the buffered clock enable signal ICKE changes from a logic low level to a logic high level at T0 to T1. After the buffered clock enable signal ICKE changes to a logic high level, the ODT control unit 150 can operate in the active/standby mode.

When the ODT signal of a logic high level is applied at T1, the rising clock RCLK and the falling clock signal FCLK are not generated at T0 to T1. Accordingly, the ODT control unit 150 of FIG. 6 crosses the clock domain from the ODT control clock signal CLKODT to the falling clock FCLK after the falling of the external clock CLK at T1 to T2. In this case, the ODT control unit 150 operates at T2 to T3, which is delayed by one clock compared with the operation under the normal clock. The RTT is formed by the rising clock RCLK at T3 to T4. In such a case, there is a problem in that the ODT turn-on delay time becomes three clocks, resulting in a very long delay time. Also, it results in a violation of TAONPD regulation that is prepared in JEDEC. For reference, DDR-II SDRAM standard describes a specification on the power down turn-on time (TAONPD) of the power down mode, which intends to apply the ODT signal until the output of the DLL circuit is stabilized. The power down turn-off time (TAOFPD) is also defined.

Meanwhile, in case when the ODT signal of a logic high level is applied after T2, that is, after all DLL clocks are re-generated, an operation of the ODT control unit 150 is identical to the above-described operation.

FIG. 10 is a timing diagram in case when the DLL clock first appears at td2 (>td1) after the precharge power down exit according to the prior art.

In FIG. 10, the timing diagram includes a case that the DLL delay time seems to be relatively longer, when the DLL circuit operates at a higher frequency than the case of FIG. 9 and thus performs a conversion with respect to the external clock CLK. Also, the timing diagram includes a case that many delay components are contained in the DLL circuit. The delay components contained in the DLL circuit includes a plurality of level shifters, which are provided in critical paths through which the clock passes in the DLL circuit using the internal voltage, a duty cycle correction (DCC) circuit, a buffered clock signal ICLK that is inputted to the delay unit in synchronization with clock in order to prevent a glitch-like clock from being inputted to the DLL circuit in the exit or entrance from or into the power down mode, and so on. These delay components are only exemplary and various delay components may occur due to circuits, which are added for improving the performance of the DLL circuit. Referring to FIG. 10, since the DLL clocks (rising clock, falling clock) are not generated during T1 to T3, the RTT is formed at T5, which is delayed by one clock compared with FIG. 9. In other words, there occurs a problem in that the ODT turn-on delay time becomes four clock cycles.

Other problems of the prior art will be described below. In case when the DRAM exits the precharge power down mode, the buffered clock signal ICLK is inputted to the DLL delay unit 143, so that the internal circuits of the DLL delay unit operate and other control units also begin to operate. At this time, the power supplied to the DLL circuit 140 becomes unstable instantaneously. Generally, in case of the DLL circuit that uses the internal voltage as the power, the instability appears greatly. Such an unstable power reflects on the rising clock signal RCLK and the falling clock signal FCLK as jitter components, thereby affecting the variation of the ODT turn-on time tAON and the ODT turn-off time tAOF much more.

When it is assumed that the power is stabilized after T6, FIG. 9 illustrates the variation of the RTT according to the DLL clock signals (rising clock signal RCLK, falling clock signal FCLK) before T6. It can be seen in FIG. 9 that the starting point of the RTT formation with respect to the clock at T4 is varied greatly.

According to the prior art, a predetermined time is required in order to generate the rising clock signal and the falling clock signal, which are not generated in the power down mode after the precharge power down exit. In other words, although the DRAM exits the power down mode during the predetermined time, no output of the DLL circuit is generated. At this time, if the clock enable signal CKE of a logic high level is applied, the ODT control unit 150 directly converts into the active/standby mode. However, since there is no rising clock signal and falling clock signal, which are the output signals of the DLL circuit and used to form the RTT in the active/standby mode, there is a problem that causes undesired RTT with respect to the ODT signal inputted from the external circuit.

Additionally, the power supplied to the DLL circuit is in the unstable state for a long time until the DLL circuit again operates after the precharge power down exit, so that the output clock signals of the DLL circuit becomes unstable. Accordingly, when the ODT control unit operates, it is difficult to properly satisfy the timing of the required RTT with respect to the applied ODT input.

SUMMARY OF THE INVENTION

It is, therefore, an object of the present invention to provide a semiconductor device using an ODT technology, which is capable of minimizing a delay of an RTT formation timing or a misalignment of RTT with respect to clock, which may occur in a conversion of ODT signal before and after a conversion of a power down mode into an active/standby mode.

It is another object of the present invention to normally process a variation of external ODT signal by detecting whether an power down exit is a precharge power down exit or an active power down exit and using a detection result for the conversion of the power down mode into the active/standby mode.

It is further another object of the present invention to normally process a variation of external ODT signal by shifting a conversion of a power down mode into an active/standby mode until an output clock signal of a DLL circuit is stabilized after a power down exit.

In an aspect of the present invention, there is provided an ODT mode conversion circuit, comprising: a clock enable control unit for receiving a precharge signal including an information on a presence of a bank access in a semiconductor memory device, detecting whether the semiconductor memory device exits a precharge power down mode or an active power down mode, and outputting a mode classification signal, the mode classification signal having different logic levels depending on the precharge power down exit and the active power down exit; an ODT control unit configured to operate in a power down mode or an active/standby mode according to the mode classification signal; and an RTT formation unit for forming an RTT according to an RTT formation control signal, the RTT formation control signal being outputted from the ODT control unit.

The clock enable control unit receives a clock enable internal signal, the precharge signal, a buffered clock signal, and a reset signal and outputs the mode classification signal, the clock enable internal signal being an internal signal of a semiconductor memory device, which has an information on a clock enable signal inputted from an external circuit, the buffered clock signal being a buffered external clock, the reset signal being a signal that initializes the clock enable control unit.

The clock enable control unit includes: a power down exit detector for receiving a clock enable internal signal and the precharge signal and outputting a precharge power down exit signal or an active power down exit signal, the clock enable internal signal being an internal signal of a semiconductor memory device, which has an information on a clock enable signal inputted from an external circuit; a clock counter for delaying the precharge power down exit signal by a predetermined time using a reset signal and a buffered clock signal, and outputting a delayed precharge power down exit signal, the reset signal being a signal that initializes the clock counter, the buffered clock signal being a buffered external clock; and a mode classification signal generator for logically combining the delayed precharge power down exit signal and the active power down exit signal and outputting the mode classification signal.

The power down exit detector includes: a clock enable detection unit for receiving the clock enable internal signal and checking a detection of a clock enable signal; and a decoding unit for receiving an output of the clock enable detection unit and the precharge signal and outputting the precharge power down exit signal and the active power down exit signal.

The clock counter includes: a latch unit for receiving the precharge power down exit signal, the reset signal and a feedback signal, which is fed back from a flip-flop unit, and outputting a latched power down exit signal; and a flip-flop unit for shifts the latched power down exit signal by a predetermined clock cycle and outputting the shifted power down exit signal.

The ODT control unit includes: an ODT control signal generator for receiving an ODT control clock signal, rising and falling clock signals outputted from a DLL circuit, and the mode classification signal and generating a control signal that is used in the ODT control signal generator; and an RTT formation control signal output unit for delaying an ODT comparison signal by a predetermined time in response to the ODT control signal generator and generating an RTT formation control signal.

The ODT control signal generator includes: a first ODT control signal generation unit for receiving the ODT control clock signal and outputting a first delay clock signal and a first delay clock bar signal, the first delay clock signal being a signal provided by delaying the ODT control clock signal by a predetermined time; a second ODT control signal generation unit for receiving the rising clock signal and the mode classification signal and outputting a delayed rising clock signal and a delayed rising clock bar signal; and a third ODT control signal generation unit for receiving the falling clock signal and the mode classification signal and outputting a delayed falling clock signal and a delayed falling clock bar signal.

The RTT formation control signal output unit includes: a first latch unit for latching the ODT comparison signal in response to the first delay clock signal and the first delay clock bar signal; a second latch unit for inverting an output phase of the first latch unit in response to the first delay clock signal and the first delay clock bar signal; a third latch unit for inverting an output phase of the second latch unit in response to the first delay clock signal and the first delay clock bar signal; a fourth latch unit for inverting an output phase of the third latch unit in response to the delay falling clock signal and the delay falling clock bar signal; a fifth latch unit for inverting an output phase of the fourth latch unit in response to the delay rising clock signal and the delay rising clock bar signal; a sixth latch unit for inverting an output phase of the fifth latch unit in response to the delay falling clock signal and the delay falling clock bar signal; and a NAND gate configured to receive the output of the fifth latch unit and an inverted output of the sixth latch unit.

The ODT mode conversion circuit according to the present invention can be applied to a semiconductor memory device. The ODT mode conversion circuit for use in the semiconductor memory device comprises: a clock enable buffering unit for buffering a clock enable signal and outputting a buffered clock enable signal; a clock buffering unit for receiving an external clock signal and outputting an ODT control clock signal; an ODT buffering unit for comparing an ODT signal with a reference voltage and outputting an ODT comparison signal; a DLL circuit for outputting a rising clock signal and a falling clock signal in response to the external clock signal; a clock enable control unit for receiving a precharge signal including an information on a presence of a bank access in a semiconductor memory device, detecting whether the semiconductor memory device exits a precharge power down mode or an active power down mode, and outputting a mode classification signal, the mode classification signal having different logic levels depending on the precharge power down exit and the active power down exit; an ODT control unit for receiving the mode classification signal, the ODT control clock signal, the ODT comparison signal, a reset signal, the rising clock signal and the falling clock signal, and outputting an RTT formation control signal, the reset signal being a signal that initializes the ODT control unit; and an RTT formation unit for turning on/off an RTT in response to the RTT formation control signal.

In another aspect of the present invention, there is provided an ODT mode conversion method, comprising the steps of: a) receiving a precharge signal to detect whether a semiconductor memory device exits a precharge power down mode or an active power down mode, and outputting a mode classification signal, the mode classification signal having different logic levels depending on the precharge power down exit and the active power down exit; b) outputting an RTT formation control signal while an operation is in a power down mode or an active/standby mode according to the mode classification signal; and c) forming an RTT according to an RTT formation control signal.

The step a) includes the steps of: d) receiving a clock enable internal signal and the precharge signal and outputting a precharge power down exit signal or an active power down exit signal, the clock enable internal signal being an internal signal of a semiconductor memory device, which has an information on a clock enable signal inputted from an external circuit; e) delaying the precharge power down exit signal by a predetermined time using a reset signal and a buffered clock signal, and outputting a delayed precharge power down exit signal, the reset signal being a signal that initializes the clock counter, the buffered clock signal being a buffered external clock; and f) logically combining the delayed precharge power down exit signal and the active power down exit signal and outputting the mode classification signal.

The step d) includes the steps of: g) receiving the clock enable internal signal and checking a detection of a clock enable signal; and h) receiving an output signal of the step g) and the precharge signal and outputting the precharge power down exit signal and the active power down exit signal.

The step b) includes the steps of: g) receiving an ODT control clock signal, rising and falling clock signals outputted from a DLL circuit, and the mode classification signal and generating a control signal that is used in an ODT control signal generator; and h) delaying an ODT comparison signal by a predetermined time in response to the output of the step g) and generating an RTT formation control signal.

According to the present invention, an information on a precharge power down exit is delayed by a predetermined time after applying a clock enable signal of a logic high level and then provided to an ODT control unit, thereby properly processing a variation of external ODT input by converting an operation mode of an ODT control unit from a power down mode to an active/standby mode.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, an ODT mode conversion circuit according to the present invention will be described in detail referring to the accompanying drawings.

Figure 11:
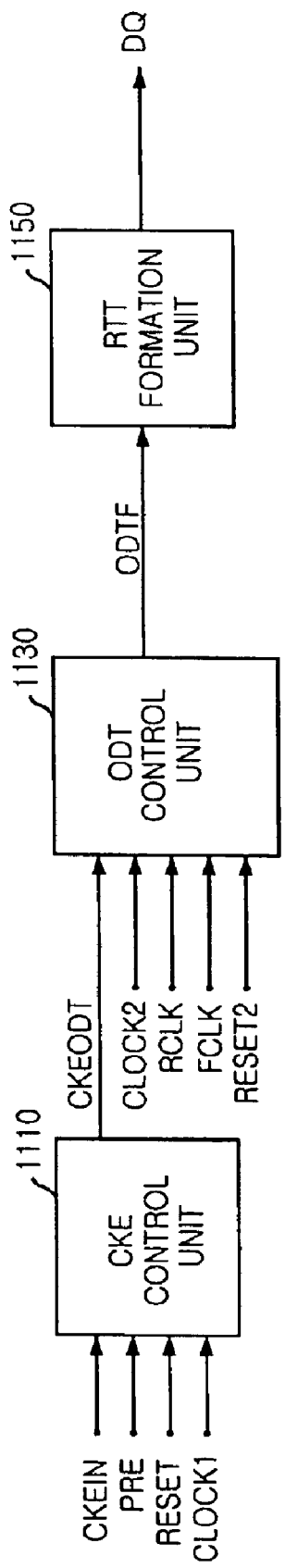
FIG. 11 is a block diagram of an ODT mode conversion circuit in accordance with the present invention.

FIG. 11 is a block diagram of an ODT mode conversion circuit in accordance with the present invention.

The ODT mode conversion circuit in accordance with the present invention includes a clock enable (CKE) control unit 1110, an ODT control unit 1130, and an RTT formation unit 1150. The CKE control unit 1110 receives a precharge signal PRE including an information on a presence of a bank access in a semiconductor device, detects whether a power down exit is a precharge power down exit or an active power down exit, and outputs a mode classification signal CKEODT, which has different logic levels depending on the precharge power down exit and the active power down exit. The ODT control unit 1130 operates in a power down mode or an active/standby mode according to the mode classification signal CKEODT and outputs an RTT formation control signal ODTF. The RTT formation unit 1150 forms an RTT according to the RTT formation control signal ODTF, which is outputted from the ODT control unit 1130.

The CKE control unit 1110 receives a clock enable internal signal CKEIN, a precharge signal PRE, a first buffered clock signal CLOCK1, and a first reset signal RESET and outputs the mode classification signal CKEODT. Here, the clock enable internal signal CKEIN is an internal signal of a semiconductor memory device, which has an information on the clock enable signal CKE inputted from an external circuit. The precharge signal PRE is an internal signal that has an information on the presence of the bank access in the semiconductor memory device. The first buffered clock signal CLOCK1 is a buffered external clock signal. The first reset signal RESET is a signal that initializes flip-flops of the CKE control unit 1110, etc. The mode classification signal CKEODT of the CKE control unit 1110 is inputted to the ODT control unit 1130.

The ODT control unit 1130 receives the mode classification signal CKEODT, a second buffered clock signal CLOCK2, a rising clock signal RCLK, a falling clock signal FCLK and a second reset signal RESET2, and outputs the RTT formation control signal ODTF. Here, the second buffered clock signal CLOCK2 is a buffered external clock signal and may be identical to the first buffered clock signal CLOCK1. Hereinafter, the first buffered clock signal CLOCK1 is considered to be identical to the second buffered clock signal CLOCK2. The rising clock signal RCLK and the falling clock signal FCLK are outputted from a DLL circuit of the semiconductor memory device. The second reset signal RESET2 is a signal that initializes the flip-flops of the ODT control unit 1130 and may be identical to the first reset signal RESET. Like the buffered clock signals, the first reset signal RESET is considered to be identical to the second reset signal RESET2. The RTT formation control signal ODTF is applied to the RTT formation unit 1150.

Figure 12:
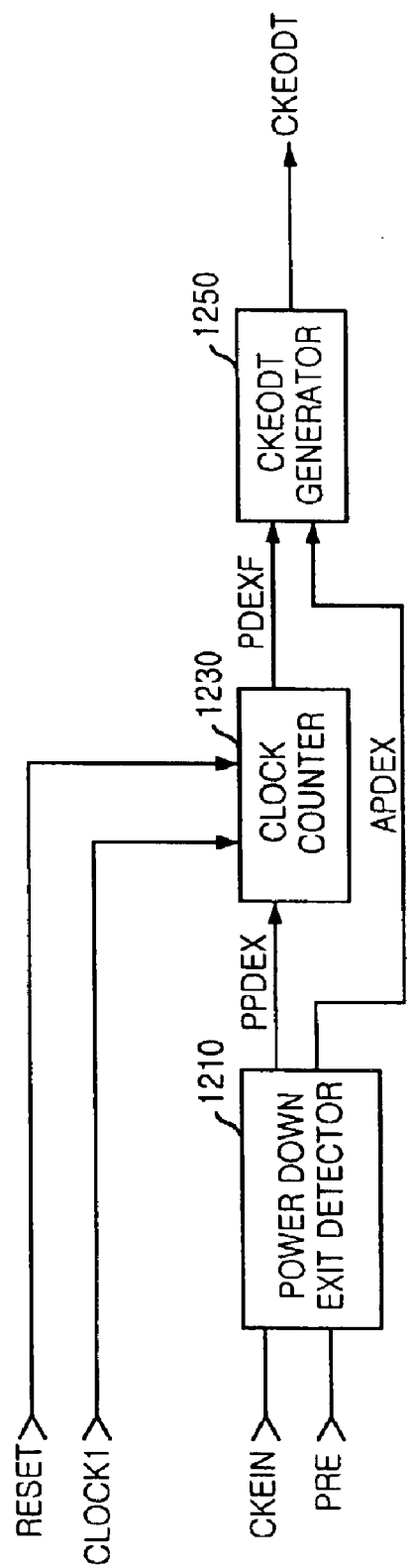
FIG. 12 is a block diagram of the CKE control unit of FIG. 11 in accordance with the present invention.

FIG. 12 is a block diagram of the CKE control unit in accordance with the present invention.

Referring to FIG. 12, the CKE control unit 1110 includes a power down exit detector 1210, a clock counter 1230, and a CKEODT generator 1250. The power down exit detector 1210 receives the clock enable internal signal CKEIN and the precharge signal PRE and outputs a precharge power down exit signal PPDEX and an active power down exit signal APDEX. The clock counter 1230 delays the precharge power down exit signal PPDEX by a predetermined time using the first reset signal RESET and the first buffered clock signal CLOCK1 and outputs a delayed precharge power down exit signal PDEXF. Here, the precharge power down exit signal PPDEX is a signal that is outputted from the power down exit detector 1210 in case when the semiconductor memory device exits the precharge power down mode. The CKEODT generator 1250 logically combines the delayed precharge power down exit signal PDEXF and the active power down exit signal APDEX and outputs the mode classification signal CKEODT. Here, the active power down exit signal APDEX is a signal that is outputted from the power down exit detector 1210 in case when the semiconductor memory device exits the active power down mode.

Figure 13:
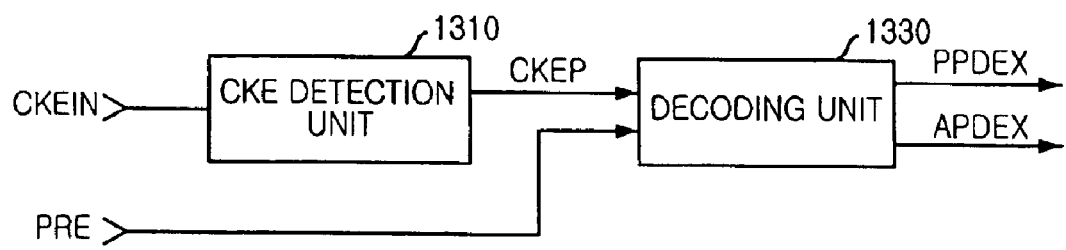
FIG. 13 is a circuit diagram of the power down exit detector of FIG. 12 in accordance with the present invention.

FIG. 13 is a circuit diagram of the power down exit detector 1210 in accordance with the present invention.

When the semiconductor memory device exits the power down mode, that is, when the clock enable signal CKE changes to a logic high level, the power down exit detector 1210 generates a flag for classifying whether the semiconductor memory device exits the precharge power down mode or the active power down mode.

The power down exit detector 1210 includes a CKE detection unit 1310 and a decoding unit 1330. The CKE 2D detection unit receives the clock enable internal signal CKEIN and checks the detection of the clock enable signal CKE. The decoding unit 1330 receives the output of the CKE detection unit 1310 and the precharge signal PRE and outputs the power down exit signals PPDEX and APDEX.

Figure 14:
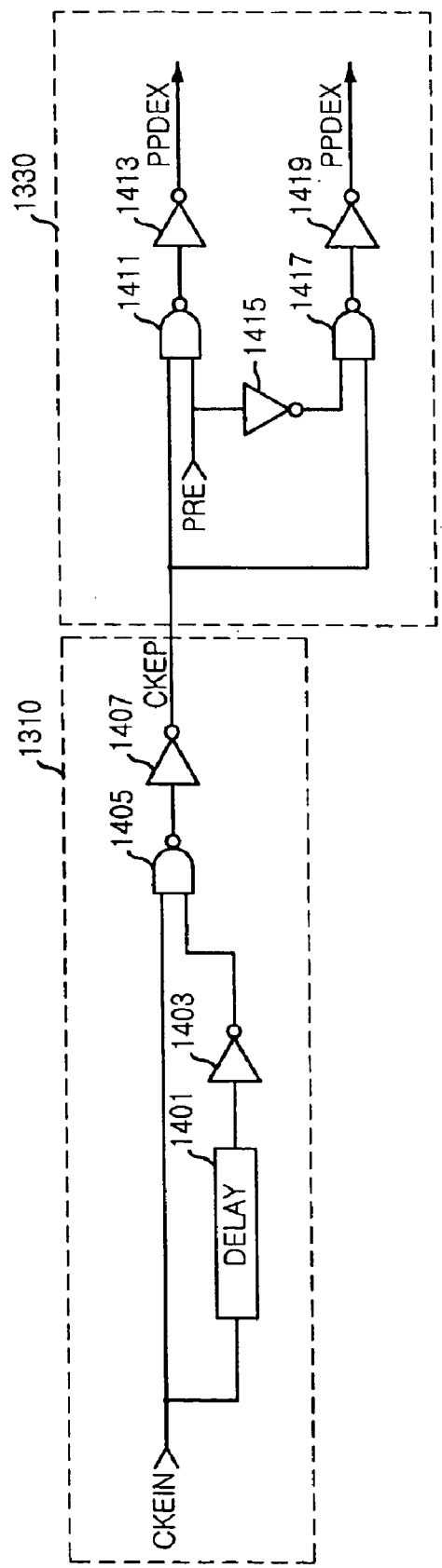
FIG. 14 is a circuit diagram of the power down exit detector of FIG. 13 in accordance with an embodiment of the present invention.

FIG. 14 is a circuit diagram of the power down exit detector 1210 in accordance with an embodiment of the present invention.

Referring to FIG. 14, the CKE detection unit 1310 includes a delay unit 1401 for delaying the clock enable internal signal CKEIN by a predetermined time, an inverter 1403 for inverting an output of the delay unit 1401, a NAND gate 1405 configured to receive the clock enable internal signal CKEIN and an output of the inverter 1403, and an inverter 1407 for inverting an output of the NAND gate 1405.

When the clock enable internal signal CKEIN changes from a logic low level to a logic high level, the CKE detection unit 1310 generates a clock enable detection signal CKEP of a predetermined pulse width, which has a clock enable information. In other words, the CKE detection unit 1310 is a kind of a detector for detecting a rising edge of the clock enable signal CKE by checking the detection of the clock enable signal CKE and outputting the clock enable detection signal CKEP.

The decoding unit 1330 includes a NAND gate 1411 configured to receive the clock enable detection signal CKEP and the precharge signal PRE, an inverter 1413 for inverting an output of the NAND gate 1411 to output the precharge power down exit signal PPDEX, an inverter 1415 for inverting the precharge signal PRE, a NAND gate 1417 configured to receive the clock enable detection signal CKEP and an output of the inverter 1415, and an inverter 1419 for inverting an output of the NAND gate 1417 to output the active power down signal APDEX.

The decoding unit 1330 may generate the precharge power down exit signal PPDEX through the combination of the clock enable detection signal CKEP and the precharge signal PRE and may generate the active power down exit signal through the NAND operation of the clock enable detection signal CKEP and the inverted precharge signal. Logic elements for generating the precharge power down exit signal PPDEX and the active power down exit signal APDEX may be combined in various manners. Since their configurations are well known to those skilled in the art, their detailed description will be omitted.

Figure 15:
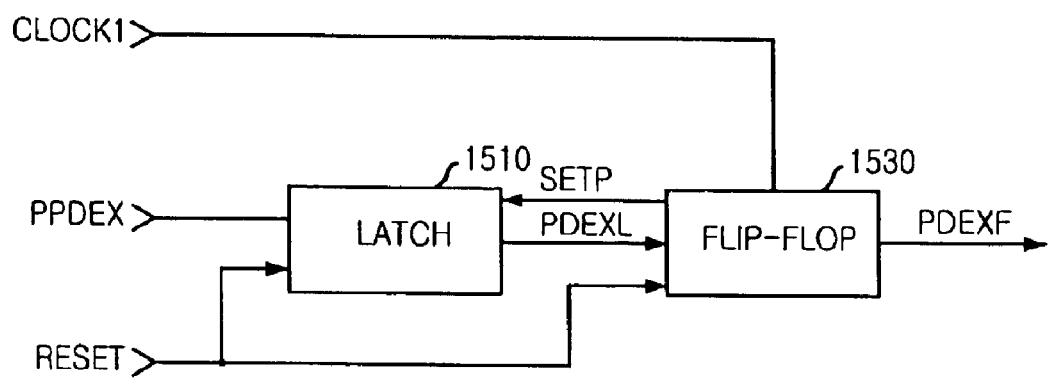
FIG. 15 is a block diagram of the clock counter of FIG. 12 in accordance with an embodiment of the present invention.

FIG. 15 is a block diagram of the clock counter 1230 of FIG. 12 in accordance with an embodiment of the present invention.

Referring to FIG. 15, the clock counter 1230 is a circuit for delaying the information on the precharge power down exit by a predetermined time. The clock counter 1230 includes a latch unit 1510 and a flip-flop unit 1530. The latch unit 1510 receives the precharge power down exit signal PPDEX, the reset signal RESET, and a feedback signal SETP that is fed back from the flip-flop unit 1530, and outputs a power down exit signal PDEXL that is latched to the flip-flop unit 1530. The flip-flop unit 1530 shifts the latched power down exit signal PDEXL by desired clock cycles and outputs the shifted power down exit signal PDEXF.

Figure 16:
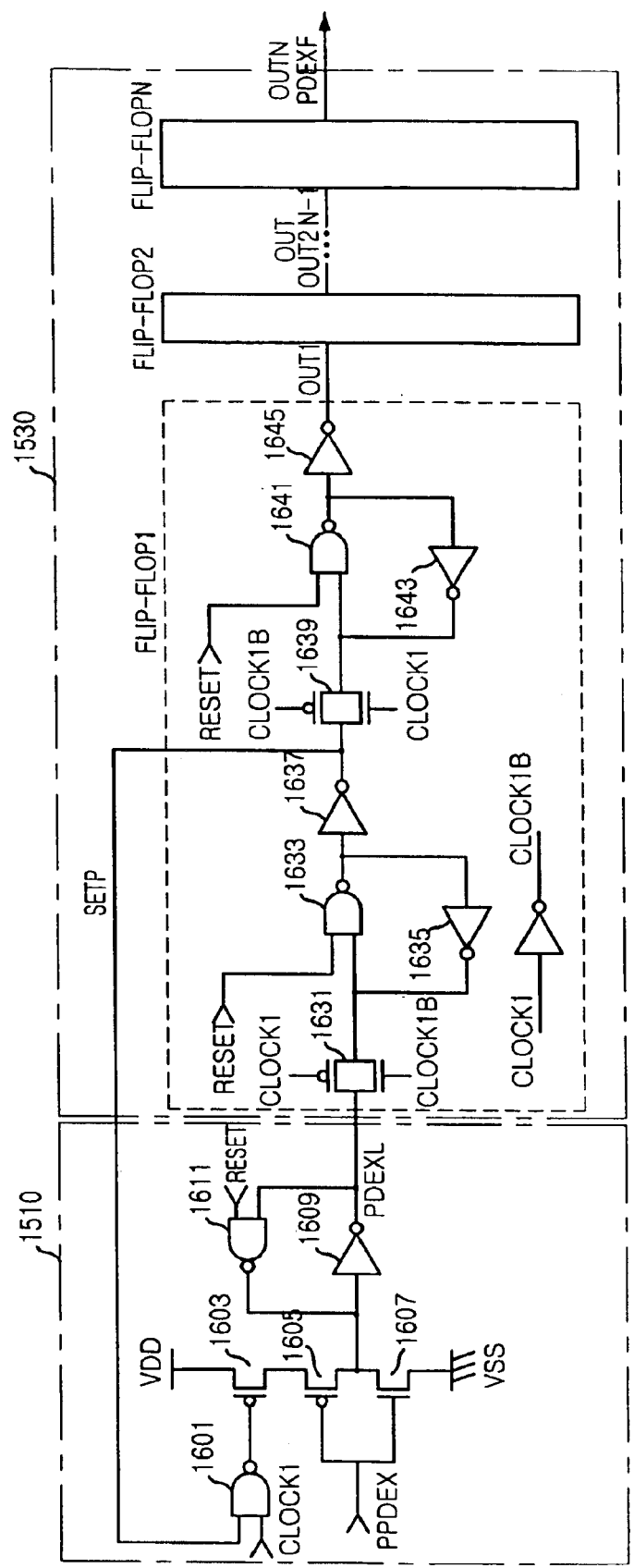
FIG. 16 is a circuit diagram of the clock counter of FIG. 12 in accordance with an embodiment of the present invention.

FIG. 16 is a circuit diagram of the clock counter 1230 in accordance with an embodiment of the present invention.

Referring to FIG. 16, the latch unit 1510 includes: a NAND gate 1601 configured to receive the feedback signal SETP and the first buffered clock signal CLOCK1; a PMOS transistor 1603 controlled by an output of the NAND gate 1601 and having one terminal connected to a power supply voltage VDD; a PMOS transistor 1605 and NMOS transistor 1607, which are controlled by the precharge power down exit signal PPDEX and connected in series between the other terminal of the PMOS transistor 1603 and a ground voltage VSS; an inverter 1609 configured to receive a signal of a common node between the PMOS transistor 1605 and the NMOS transistor 1607; and a NAND gate 1611 configured to receive the output PDEXL of the inverter 1609 and the reset signal RESET and output the NANDed signal to the common node.

The latch unit 1510 latches the precharge power down exit signal PPDEX and maintains the latched precharge power down exit signal until a next rising edge of the first buffered clock signal CLOCK1. The feedback signal SETP is an output signal of a master latch in a first flip-flop of the flip-flop unit 1530. The power down exit signal PDEXL, which is latched at a next rising edge of the first buffered clock signal CLOCK1 after the feedback signal SETP changes to a logic low level, changes to a logic low level.

Figure 18:
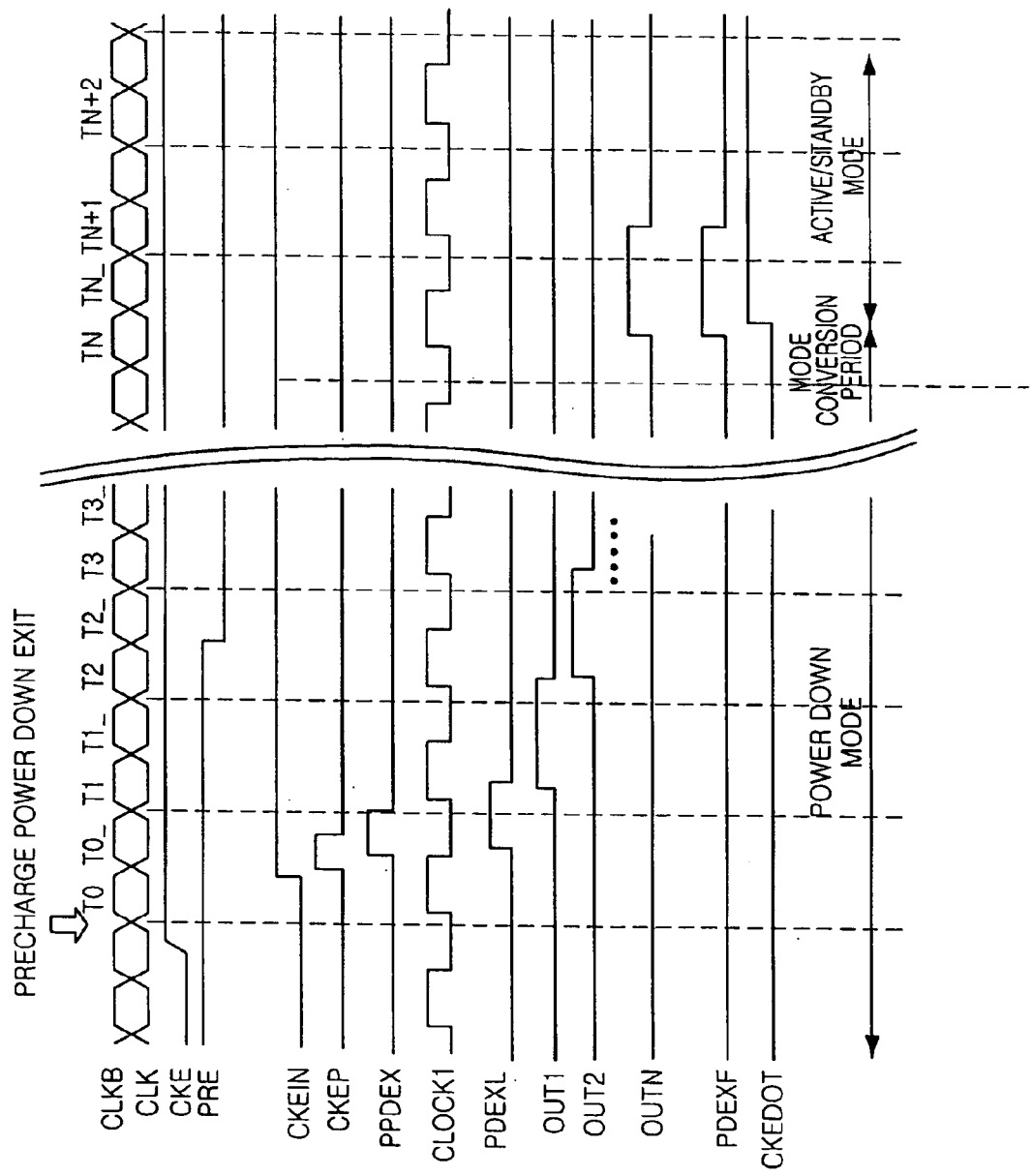
FIG. 18 is a timing diagram of the CKE control unit in accordance with the present invention.

FIG. 18 is a timing diagram of the CKE control unit in accordance with the present invention.

In FIG. 16, there is shown the flip-flop unit 1530 in accordance with an embodiment of the present invention.

Referring to FIG. 16, a first flip-flop FLIP-FLOP1 includes: a transmission gate 1631 for transmitting the output PDEXL of the latch unit 1510 in response to the first buffered clock signals CLOCK1 and CLOCK1B; a NAND gate 1633 configured to receive an output of the transmission gate 1631 and the reset signal RESET; an inverter 1635 for inverting an output of the NAND gate 1633 to output the inverted signal to an output node of the transmission gate 1631; an inverter 1637 for inverting the output of the NAND gate; a transmission gate 1639 for transmitting an output of the inverter 1637 in response to the first buffered clock signals CLOCK1B and CLOCK1; a NAND gate 1641 configured to receive an output of the transmission gate 1639 and the reset signal RESET; an inverter 1643 for inverting an output of the NAND gate 1641 to output the inverted signal to an output node of the transmission gate 1639; and an inverter 1645 for inverting the output of the NAND gate.

The flip-flop unit 1530 may be configured by serially connecting the first flip-flops FLOP-FLOP1, which are triggered at positive edges. Thus, the flip-flop unit 1530 shifts the latched power down exit signal PDEXL by desired clock cycles and then outputs the signal PDEXF. The output PDEXF of the flip-flop unit 1530, which is shifted up to Tn, is inputted to the CKDODT generator 1250. FIG. 18 is a timing diagram illustrating the respective outputs OUT1, OUT2, ..., OUTN of the clock counter.

The ODT control unit 1130 includes an ODT control signal generator and an RTT formation control signal output unit. The ODT control signal generator receives the ODT control clock signal CLKODT, the rising clock signal RCLK, the falling clock signal FCLK, and the mode classification signal CKEODT and generates a control signal. The RTT formation control signal output unit delays the ODT comparison signal ODT1 by a predetermined time and generates the RTT formation control signal ODTF. Here, the ODT comparison signal ODT1 is inputted under a control of the control signal that is outputted from the ODT control signal generator.

Figure 6:
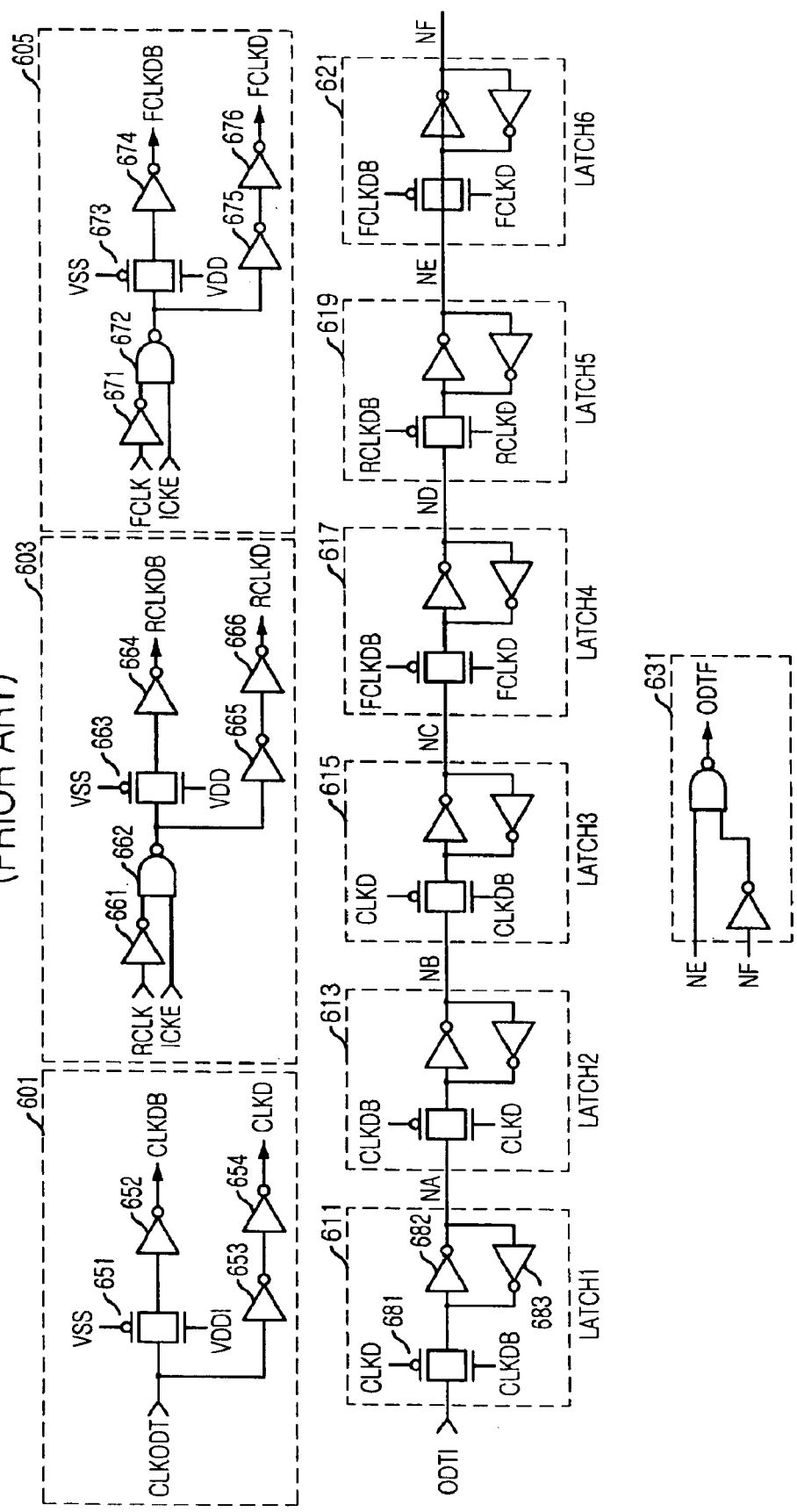
FIG. 6 is a circuit diagram of an ODT control unit of FIG. 3.
Figure 7:
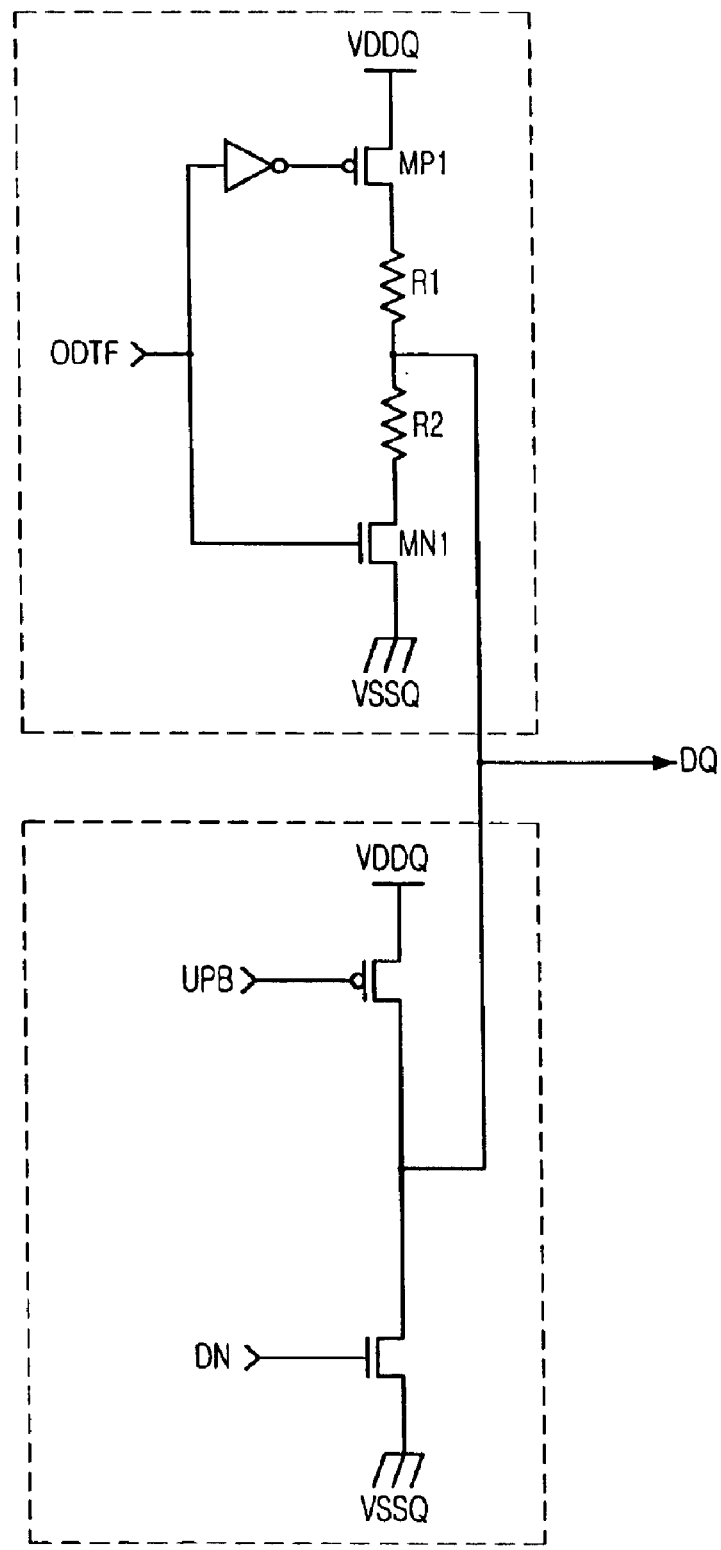
FIG. 7 is a circuit diagram of an RTT formation unit of FIG. 3.
Figure 8:
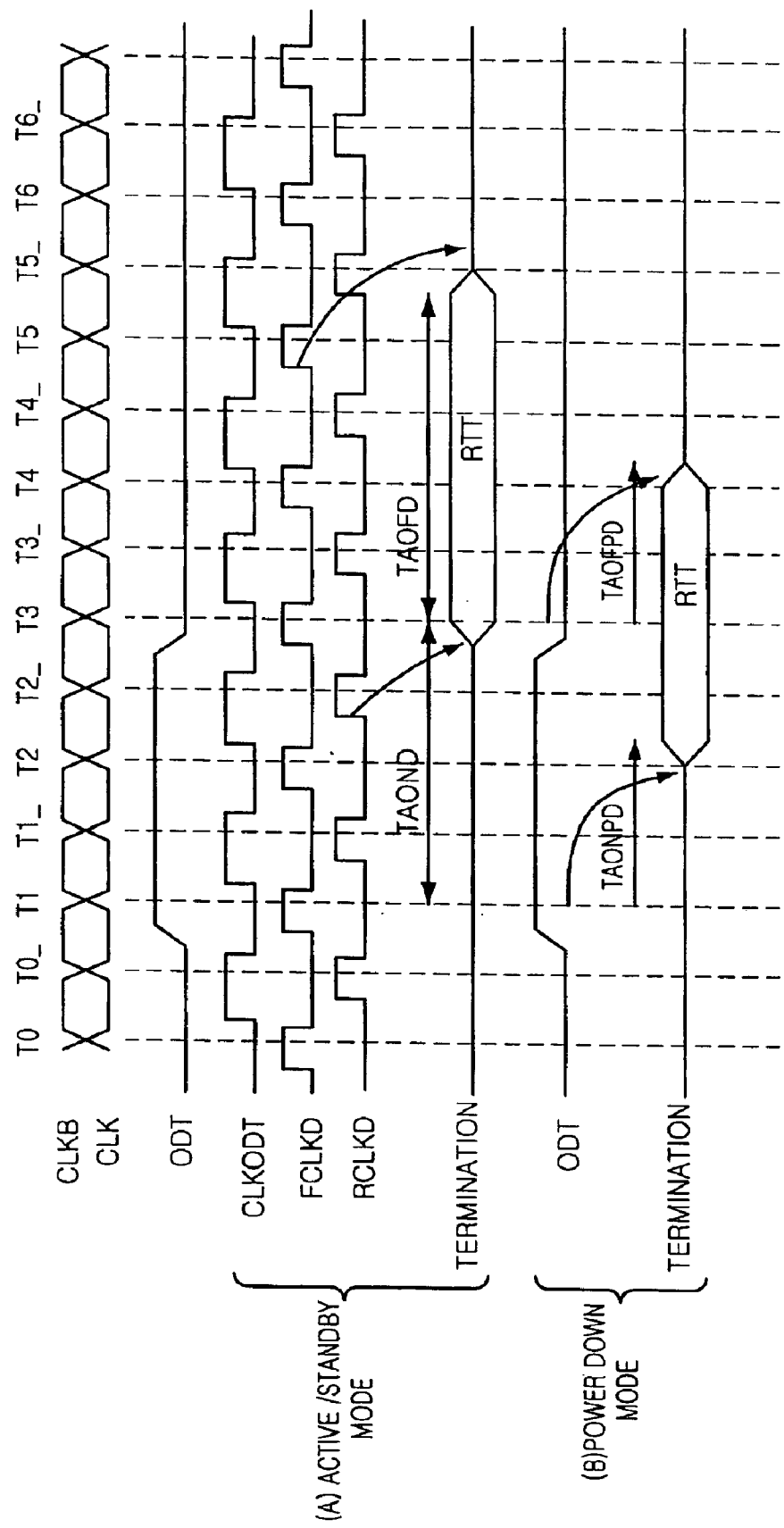
FIG. 8 is a timing diagram of an ODT control unit in an active/standby mode and a power down mode according to the prior art.
Figure 9:
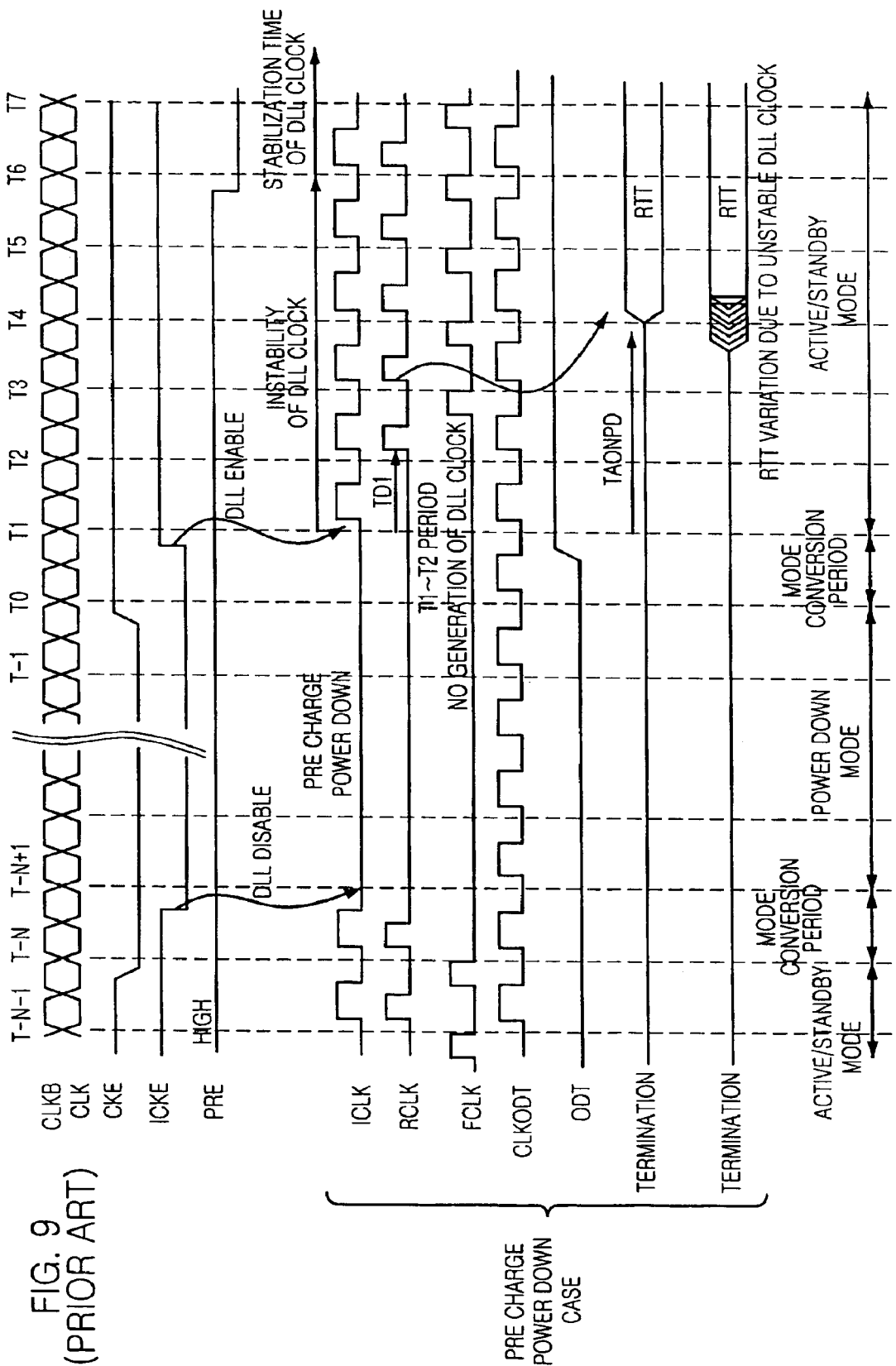
FIG. 9 is a timing diagram illustrating an ODT turn-on operation after a precharge power down exit according to the prior art.
Figure 10:
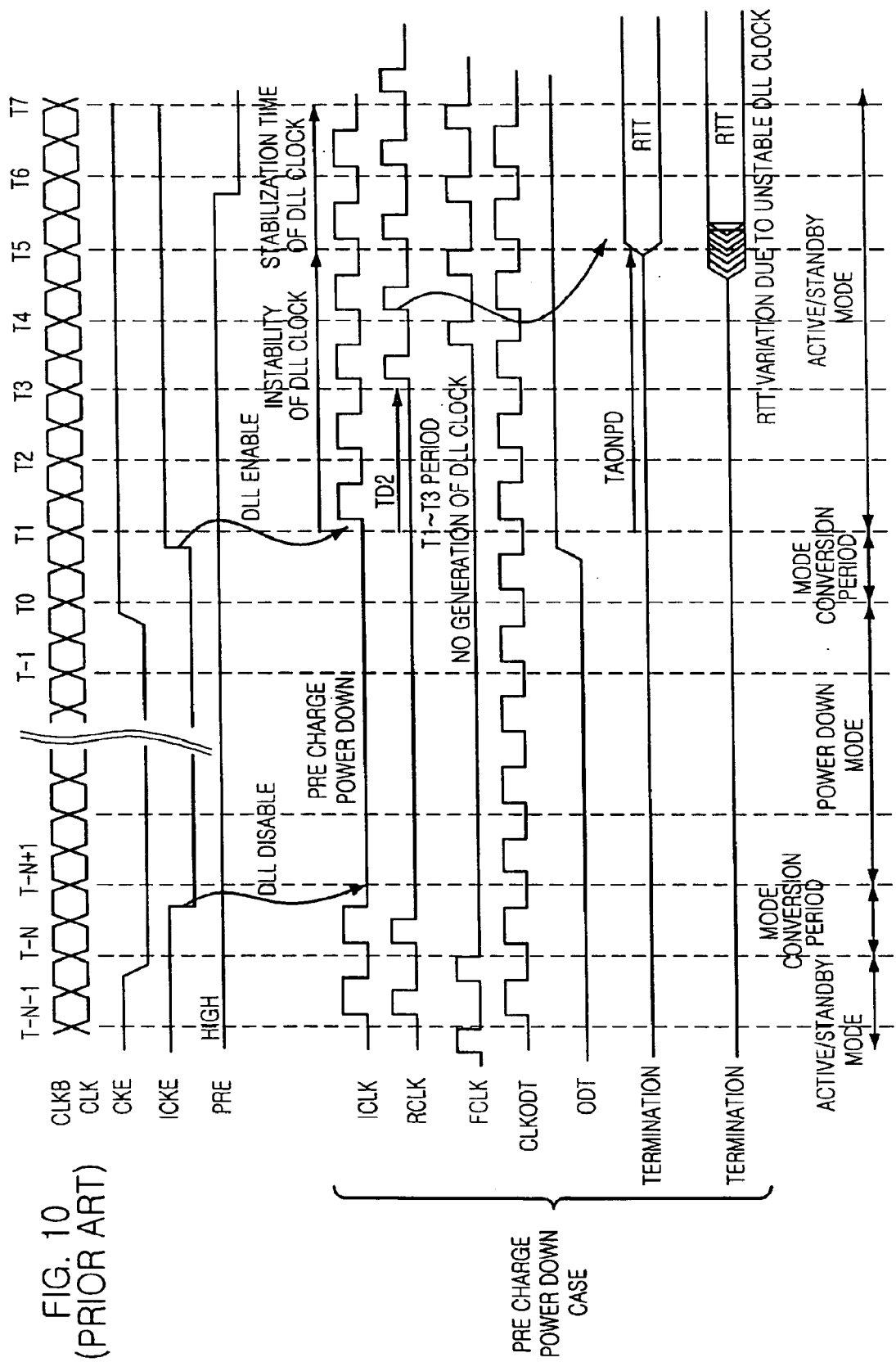
FIG. 10 is a timing diagram in case when a DLL clock first appears at td2(>td1) after a precharge power down exit according to the prior art.

Referring to FIG. 6, the ODT control signal generator may include a first ODT control signal generation unit 601, a second ODT control signal generation unit 603, and a third ODT control signal generation unit 605. The first ODT control signal generation unit 601 receives the ODT control clock signal CLKODT and outputs a first delay clock signal CLKD and a first delay clock bar signal. Here, the first delay clock signal is a signal provided by delaying the ODT control clock signal CLKODT by a predetermined time. The second ODT control signal generation unit 603 receives the rising clock signal RCLK and the mode classification signal CKEODT and outputs a delayed rising clock signal RCLKD and a delayed rising clock bar signal RCLKDB. The third ODT control signal generation unit 605 receives the falling clock signal FCLK and the mode classification signal CKEODT and outputs a delayed falling clock signal FCLKD and a delayed falling clock bar signal FCLKDB.

The first ODT control signal generation unit 601 includes a transmission gate 651 for transmitting the ODT control clock signal CLKODT in response to the ground voltage VSS and the power supply voltage VDD, an inverter 651 for inverting an output of the transmission gate 651, and a plurality of serially-connected inverters 653 and 654 for delaying the ODT control clock signal CLKODT.

The second ODT control signal generation unit 603 includes: an inverter 661 for inverting the rising clock signal RCLK; a NAND gate 662 configured to receive an output of the inverter 661 and the mode classification signal CKEODT; a transmission gate 663 for transmitting an output of the NAND gate 662 in response to the ground voltage VSS and the power supply voltage VDD; an inverter 664 for inverting an output of the transmission gate 663; and a plurality of serially-connected inverters 665 and 666 for delaying the output of the NAND gate 662.

The third ODT control signal generation unit 605 has the same structure as the second ODT control signal generation unit 603, except that the falling clock signal FCLK instead of the rising clock signal RCLK is used as the input signal.

The RTT formation control signal output unit includes: a first latch unit 611 for latching the ODT comparison signal ODTI in response to the first delay clock CLKD and the first delay clock bar signal CLKDB; a second latch unit 613 for inverting an output phase of the first latch unit 611 in response to the first delay clock bar signal CLKDB and the first delay clock signal CLKD; a third latch unit 615 for inverting an output phase of the second latch unit 613 in response to the first delay clock signal CLKD and the first delay clock bar signal CLKDB; a fourth latch unit 617 for inverting an output phase of the third latch unit 615 in response to the delay falling clock signal FCLKD and the delay falling clock bar signal FCLKDB; a fifth latch unit 619 for inverting an output phase of the fourth latch unit 617 in response to the delay rising clock signal RCLKD and the delay rising clock bar signal RCLKDB; a sixth latch unit 621 for inverting an output phase of the fifth latch unit 619 in response to the delay falling clock signal FCLKD and the delay falling clock bar signal FCLKDB; and a NAND gate 631 configured to receive the output of the fifth latch unit 619 and an inverted output of the sixth latch unit 621.

The first latch unit 611 includes a transmission gate 681 for transmitting the ODT comparison signal ODT1 in response to the first delay clock signal CLKD and the first delay clock bar signal CLKDB, and inverters 682 and 683 that are connected back-to-back to latch an output of the transmission gate 681.

Figure 17:
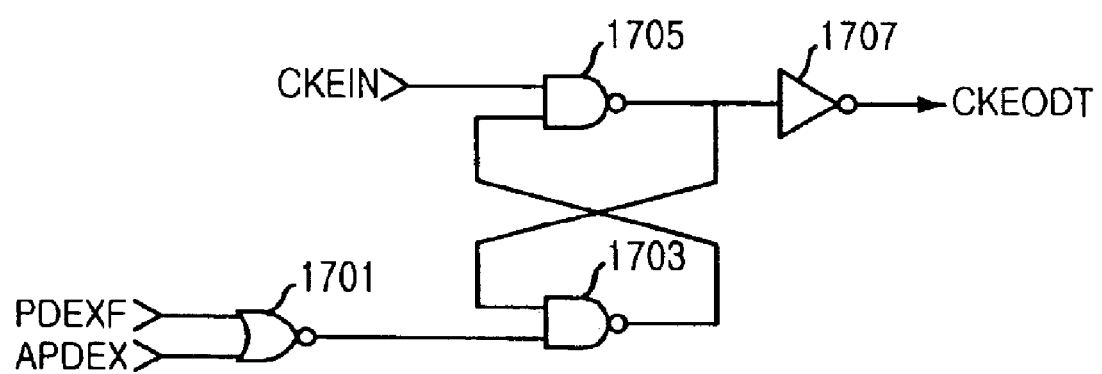
FIG. 17 is a circuit diagram of the CKEODT generator of FIG. 12 in accordance with an embodiment of the present invention.

FIG. 17 is a circuit diagram of the CKEODT generator 1250 of FIG. 12 in accordance with an embodiment of the present invention.

The CKEODT generator 1250 receives the clock enable internal signal CKEIN, the output PDEXF of the flip-flop unit 1530 and the active power down exit signal APDEX, and outputs the mode classification signal CKEODT for classifying the operation mode of the ODT control unit.

The CKEODT generator 1250 includes a NOR gate 1701 configured to receive the output PDEXF of the flip-flop unit 1530 and the active power down exit signal APDEX, a NAND gate 1703 configured to receive an output of the NOR gate 1701 and an output of a NAND gate 1705, and the NAND gate 1705 configured to receive the clock enable internal signal CKEIN and an output of the NAND gate 1703, and an inverter 1707 for inverting the output of the NAND gate 1705.

In the entrance into the power down mode, the clock enable signal CKE of a logic low level is applied. Therefore, if the clock enable internal signal CKEIN changes to a logic low level, the mode classification signal CKEODT changes to a logic low level.

In the precharge power down exit, even if the clock enable signal CKE changes to a logic high level, the output PDEXF of the flip-flop unit 1530 changes to a logic high level. Therefore, the state of the mode classification signal CKEODT does not change until the latch of the CKEODT generator 1250 is released. In other words, unlike the prior art, the ODT circuit can operate in the power down mode at T0 to Tn of FIG. 18. If the signal PDEXF is generated from the flip-flop unit 1530 at Tn, the mode classification signal CKEODT changes to a logic high level. Therefore, the ODT circuit converts into the standby mode.

In the active power down exit, the active power down exit signal APDEX is outputted from the power down exit detector 1210, thereby releasing the input latch state of the CKEODT generator 1250. Therefore, the ODT circuit exits the power down mode and also converts into the active mode.

Figure 19:
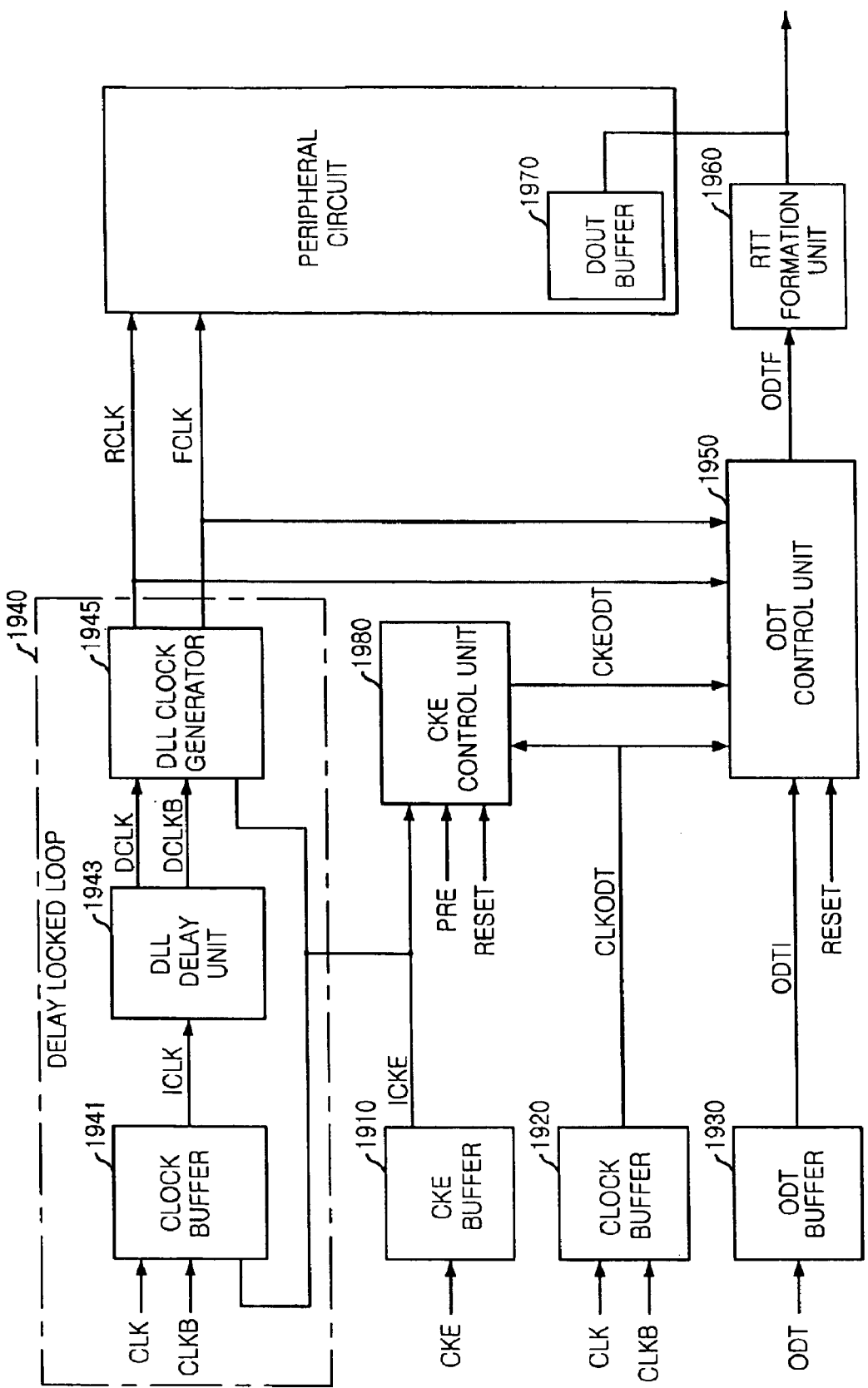
FIG. 19 is a block diagram of a semiconductor memory device, in which the ODT mode conversion technology of the present invention is applied.

FIG. 19 is a block diagram of a semiconductor memory device, in which the ODT mode conversion technology of the present invention is applied. The semiconductor memory device of FIG. 19 is merely an exemplary embodiment and the present invention is not limited to it.

Referring to FIG. 19, a clock enable buffer 1910 receives and buffers the clock enable signal CKE and outputs the buffered clock enable signal ICKE. A clock buffer 1920 receives the external clock signal CLK and the external clock bar signal CLKB and outputs the ODT control clock signal CLKODT, which is a signal used in the ODT control unit. An ODT buffer 1930 compares the ODT signal ODT with the reference voltage Vref and outputs the ODT comparison signal ODTI. A DLL circuit 1940 outputs the rising clock signal RCLK and the falling clock signal FCLK in response to the external clock signal CLK and the external clock bar signal CLKB. A CKE control unit 1980 receives the precharge signal, detects whether the semiconductor memory device exits the precharge power down mode or the active power down mode, and outputs the mode classification signal having different logic levels depending on the precharge power down exit and the active power down exit. An ODT control unit 1950 receives the mode classification signal CKEODT, the ODT control clock signal CLKODT, the ODT comparison signal ODTI, the reset signal RESET, the rising clock signal RCLK and the falling clock signal FCLK, and outputs the RTT formation control signal ODTF. An RTT formation unit 1960 turns on/off the RTT in response to the RTT formation control signal ODTF.

Figure 1:
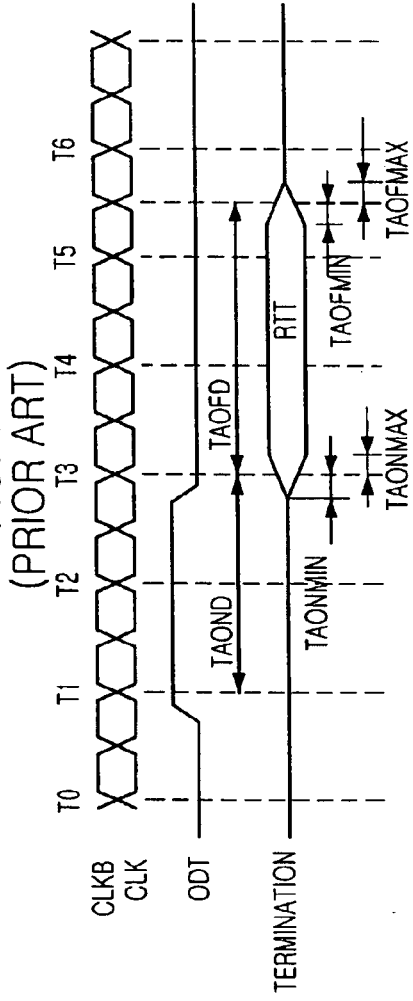
FIG. 1 is an ODT timing diagram in an active/standby mode according to the prior art.
Figure 2:
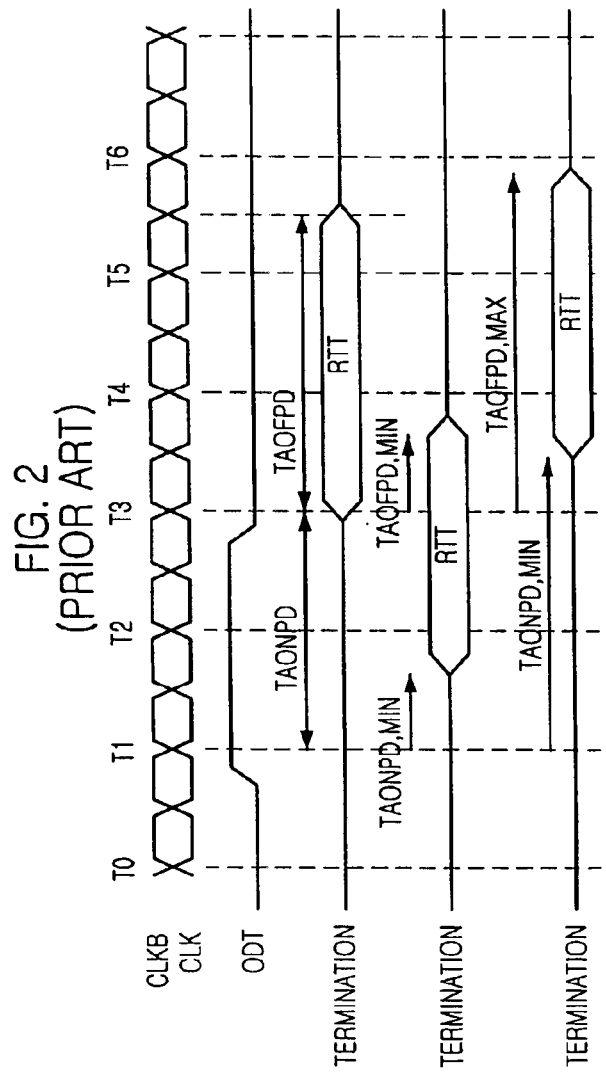
FIG. 2 is an ODT timing diagram in a power down mode according to the prior art.
Figure 3:
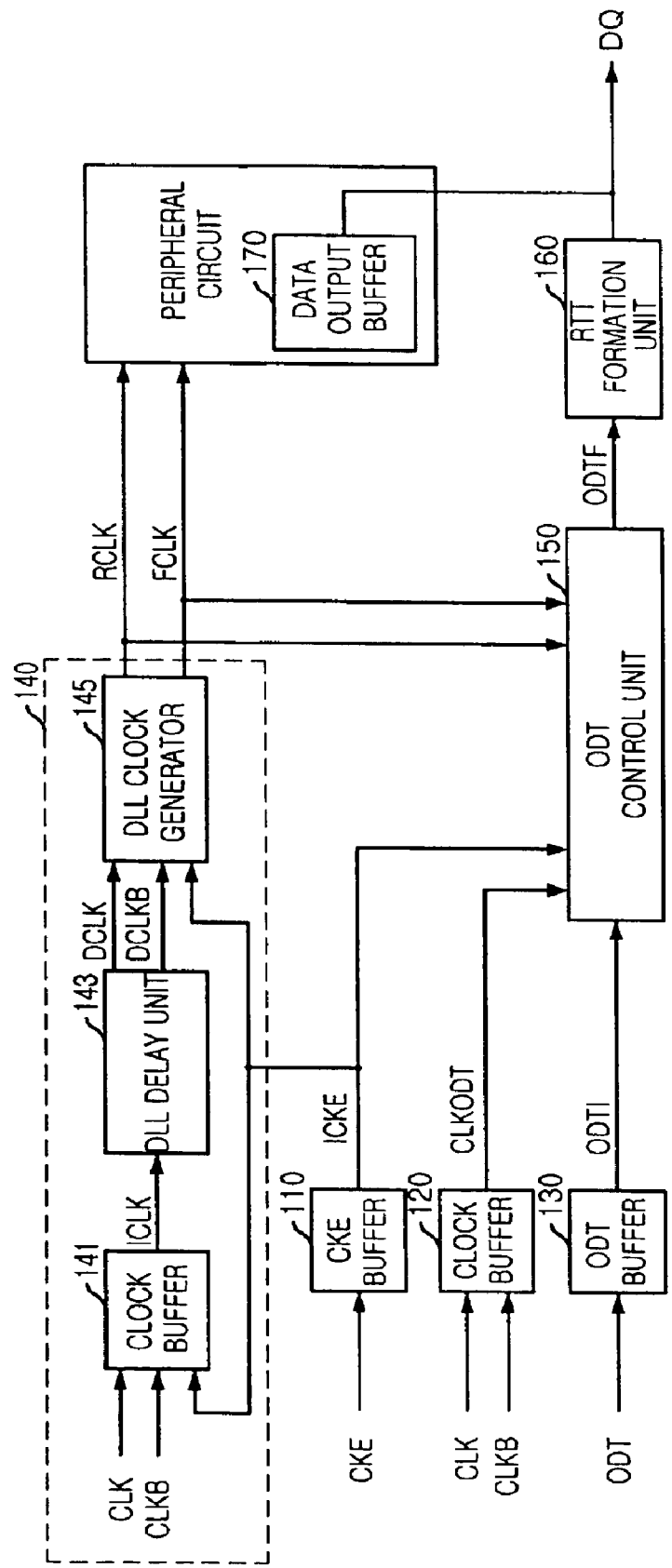
FIG. 3 is a block diagram of an ODT operation according to the prior art.
Figure 4:
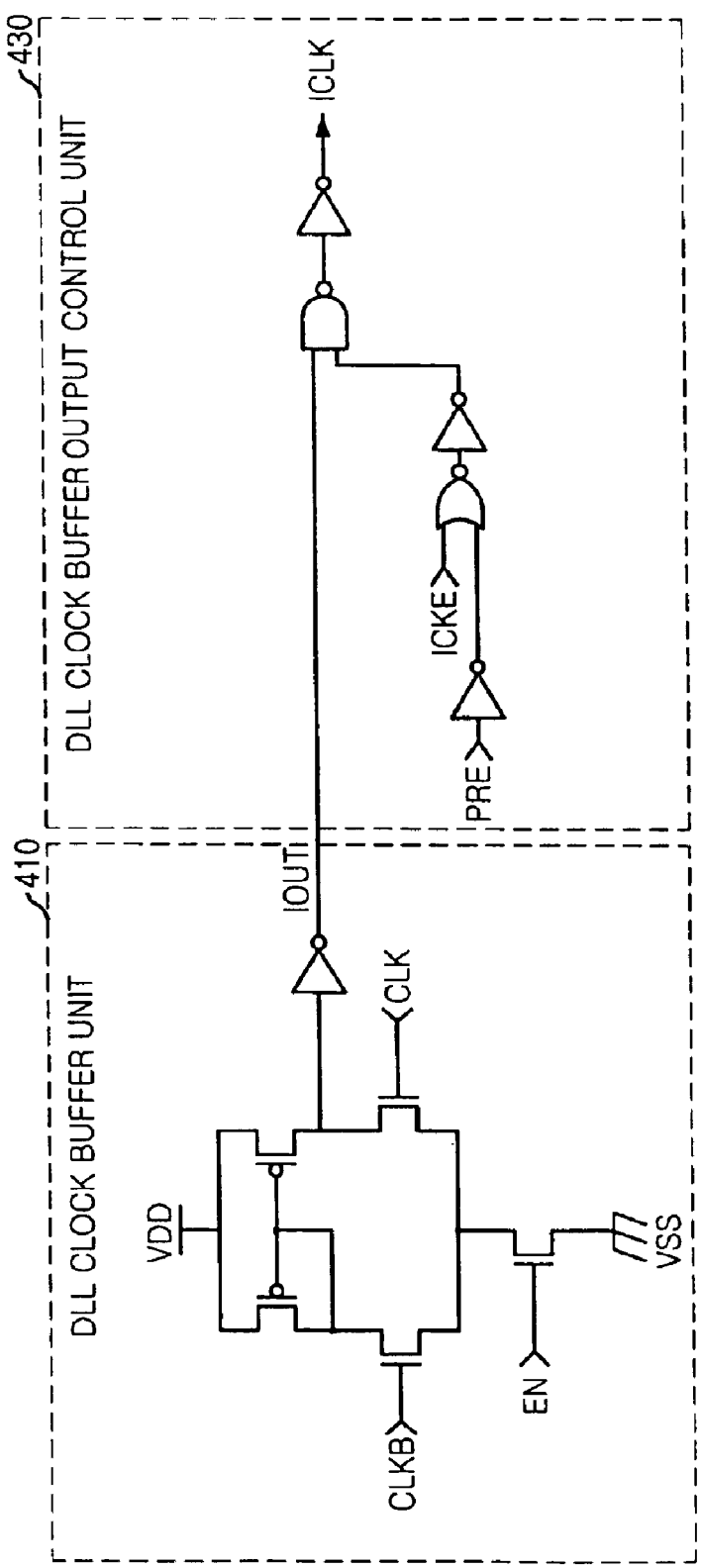
FIG. 4 is a circuit diagram of a DLL clock buffer of FIG. 3.
Figure 5:
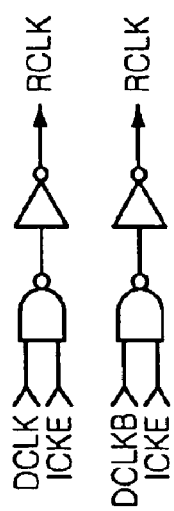
FIG. 5 is a circuit diagram of a DLL clock generator of FIG. 3.

The above-described function of the clock enable internal signal CKEIN is performed by the buffered clock enable signal ICKE, and the above-described functions of the first and second buffered clock signal CLOCK1 and CLOCK2 are performed by the ODT control clock signal CLKODT. Compared with the prior art of FIG. 3, the CKE control unit 1980, the precharge signal PRE and the reset signal RESET are provided additionally.

Figure 20:
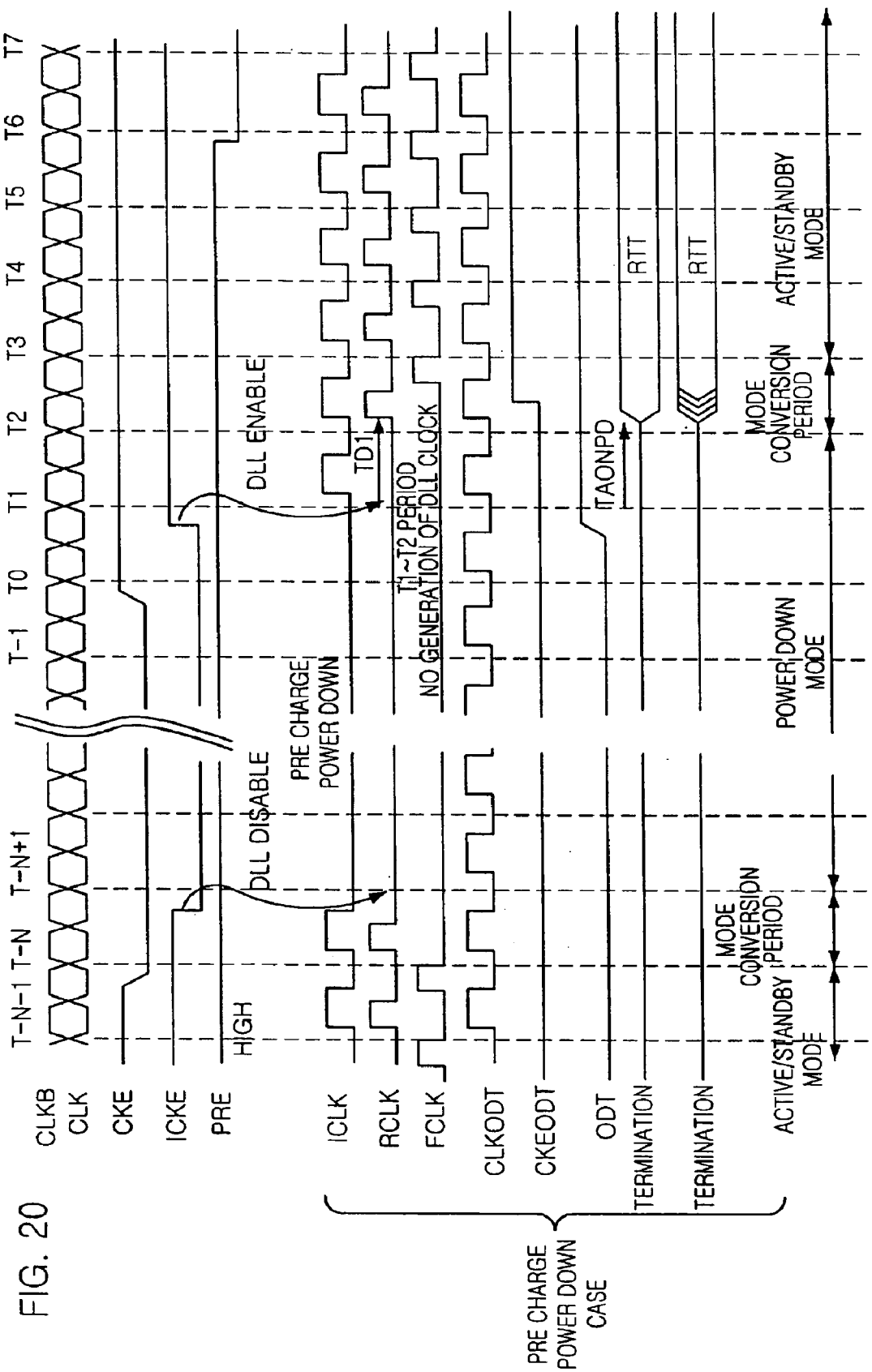
FIG. 20 is a first timing diagram of the circuit shown in FIG. 19.
Figure 21:
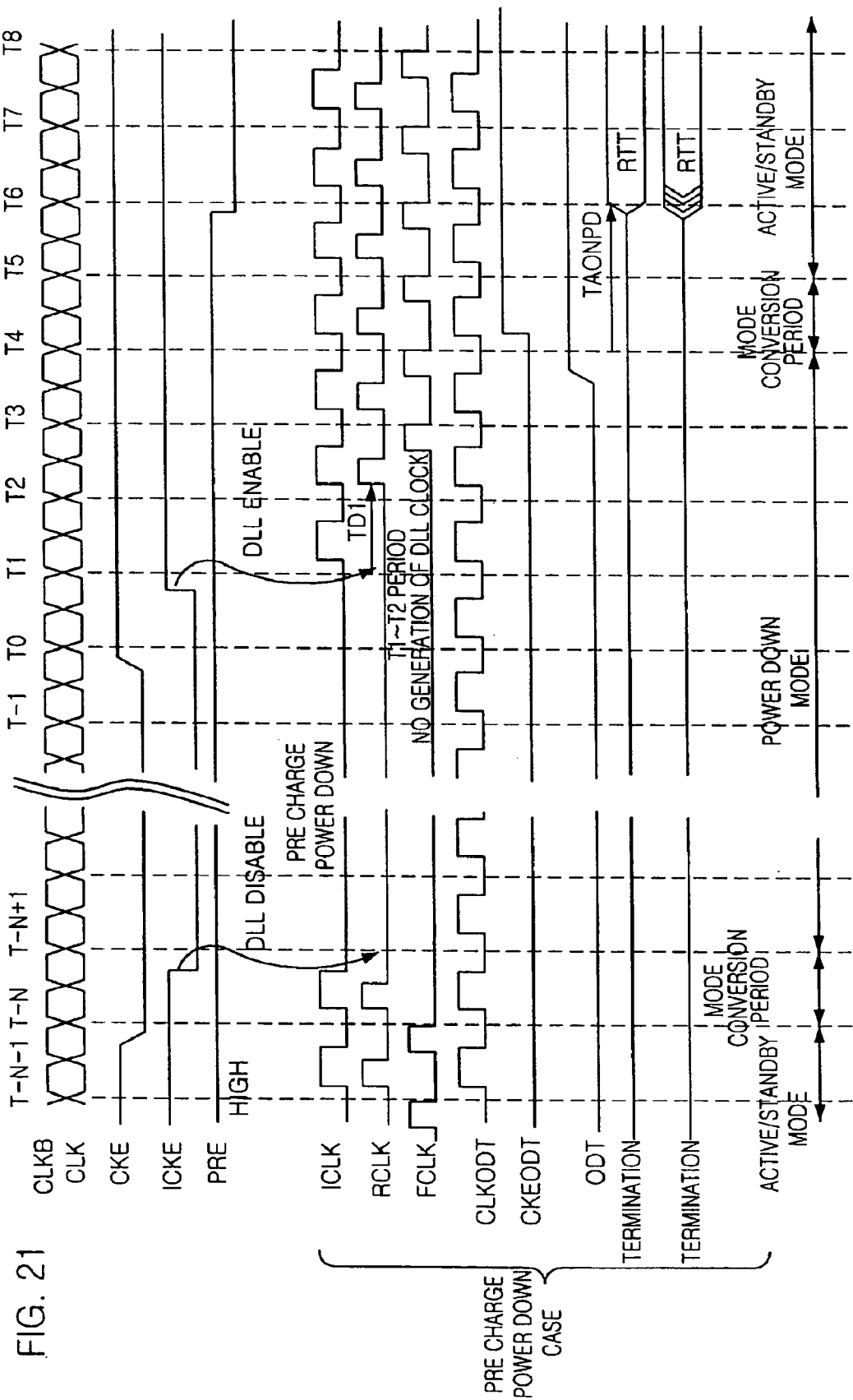
FIG. 21 is a second timing diagram of the circuit shown in FIG. 19.

FIGS. 20 and 21 are timing diagrams of the circuit shown in FIG. 19. FIG. 20 is a timing diagram in case when the generation of the mode classification signal CKEODT is shifted to the starting points of the rising and falling clock signals RCLK and FCLK. FIG. 21 is a timing diagram in case when the generation of the mode classification signal CKEODT is shifted to the time when the rising and falling clock signals RCLK and FCLK are stabilized.

Referring to FIG. 20, even if the ODT signal of a logic high level is applied at T1, the mode classification signal CKEODT is still in a logic low level. Therefore, the ODT control unit operates in the power down mode. In other words, according to the prior art, a long delay time occurs because the ODT turn-on delay time TAONPD is three clock cycles and the required specification cannot be satisfied. However, according to the present invention, the ODT control unit operates at "0.5 clock+asynchronous delay time" and forms the RTT at T2 to T3.

Referring to FIG. 21, the ODT signal that is applied before T4 is operated in the power down mode, the RTT can be turned on/off using the rising and falling clock signals RCLK and FCLK from T4, in which the rising and falling clock signals RCLK and FCLK become stable.

Also, an ODT mode conversion method in accordance with the present invention includes the steps of: a) receiving a precharge signal to detect whether a semiconductor memory device exits a precharge power down mode or an active power down mode, and outputting a mode classification signal CKEODT, the mode classification signal CKEODT having different logic levels depending on the precharge power down exit and the active power down exit; b) outputting an RTT formation control signal while an operation is in a power down mode or an active/standby mode according to the mode classification signal; and c) forming an RTT according to an RTT formation control signal.

The step a) may include the steps of: d) receiving a clock enable internal signal and the precharge signal and outputting a precharge power down exit signal or an active power down exit signal, the clock enable internal signal being an internal signal of a semiconductor memory device, which has an information on a clock enable signal inputted from an external circuit; e) delaying the precharge power down exit signal by a predetermined time using a reset signal and a buffered clock signal, and outputting a delayed precharge power down exit signal, the reset signal being a signal that initializes the clock counter, the buffered clock signal being a buffered external clock signal; and f) logically combining the delayed precharge power down exit signal and the active power down exit signal and outputting the mode classification signal.

The step d) may include the steps of: g) receiving the clock enable internal signal and checking a detection of a clock enable signal; and h) receiving an output signal of the step g) and the precharge signal and outputting the precharge power down exit signal and the active power down exit signal.

Also, the step b) may include the steps of: g) receiving an ODT control clock signal, rising and falling clock signals outputted from a DLL circuit, and the mode classification signal and generating a control signal that is used in an ODT control signal generator; and h) delaying an ODT comparison signal by a predetermined time in response to the output of the step g) and generating an RTT formation control signal.

According to the present invention, a variation of external ODT signal can be normally processed by detecting whether a power down exit is a precharge power down exit or an active power down exit and using a detection result for the conversion of the power down mode into the active/standby mode.

Further, a variation of external ODT signal can be normally processed by shifting the conversion of the power down mode into the active/standby mode until an output clock signal of a DLL circuit is stabilized after the power down exit.

While the present invention has been described with respect to the particular embodiments, it will be apparent to those skilled in the art that various changes and modifications may be made without departing from the spirit and scope of the invention as defined in the following claims.

What is claimed is:

1. An ODT mode conversion circuit, comprising:
   a clock enable control unit for receiving a precharge signal including an information on a presence of a bank access in a semiconductor memory device, detecting whether the semiconductor memory device exits a precharge power down mode or an active power down mode, and outputting a mode classification signal, the mode classification signal having different logic levels depending on the precharge power down exit and the active power down exit;

an ODT control unit configured to operate in a power down mode or an active/standby mode according to the mode classification signal; and an RTT formation unit for forming an RTT according to an RTT formation control signal, the RTT formation control signal being outputted from the ODT control unit.

2. The ODT mode conversion circuit as recited in claim 1, wherein the clock enable control unit receives a clock enable internal signal, the precharge signal, a buffered clock signal, and a reset signal and outputs the mode classification signal, the clock enable internal signal being an internal signal of a semiconductor memory device, which has an information on a clock enable signal inputted from an external circuit, the buffered clock signal being a buffered external clock signal, the reset signal being a signal that initializes the clock enable control unit.

3. The ODT mode conversion circuit as recited in claim 1, wherein the clock enable control unit includes:

a power down exit detector for receiving a clock enable internal signal and the precharge signal and outputting a precharge power down exit signal or an active power down exit signal, the clock enable internal signal being an internal signal of a semiconductor memory device, which has an information on a clock enable signal inputted from an external circuit;

a clock counter for delaying the precharge power down exit signal by a predetermined time using a reset signal and a buffered clock signal, and outputting a delayed precharge power down exit signal, the reset signal being a signal that initializes the clock counter, the buffered clock signal being a buffered external clock signal; and a mode classification signal generator for logically combining the delayed precharge power down exit signal and the active power down exit signal and outputting the mode classification signal.

4. The ODT mode conversion circuit as recited in claim 3, wherein the power down exit detector includes:

a clock enable detection unit for receiving the clock enable internal signal and checking a detection of a clock enable signal; and a decoding unit for receiving an output of the clock enable detection unit and the precharge signal and outputting the precharge power down exit signal and the active power down exit signal.

5. The ODT mode conversion circuit as recited in claim 4, wherein the clock enable detection unit includes:

a delay unit for delaying the clock enable internal signal by a predetermined time;

a first inverter for inverting an output of the delay unit;

a first NAND gate configured to receive the clock enable internal signal and an output of the inverter; and a second inverter for inverting an output of the NAND gate.

6. The ODT mode conversion circuit as recited in claim 5, wherein the decoding unit includes:

a second NAND gate configured to receive an output of the clock enable detection unit and the precharge signal;

a third inverter for inverting an output of the second NAND gate to output the precharge power down exit signal;

a fourth inverter for inverting the precharge signal;

a third NAND gate configured to receive the output of the clock enable detection unit and an output of the fourth inverter; and a fifth inverter for inverting an output of the third NAND gate to output the active power down exit signal.

7. The ODT mode conversion circuit as recited in claim 3, wherein the clock counter includes:

a latch unit for receiving the precharge power down exit signal, the reset signal and a feedback signal, which is fed back from a flip-flop unit, and outputting a latched power down exit signal; and a flip-flop unit for shifts the latched power down exit signal by a predetermined clock cycle and outputting the shifted power down exit signal.

8. The ODT mode conversion circuit as recited in claim 7, wherein the latch unit includes:

a first NAND gate configured to receive the feedback signal and the buffered clock signal;

a first PMOS transistor controlled by an output of the first NAND gate, the first PMOS transistor having one terminal connected to a power supply voltage;

a second PMOS transistor and an NMOS transistor, connected in series between the other terminal of the first PMOS transistor and a ground voltage, the second PMOS transistor and the NMOS transistor being controlled by the precharge power down exit signal;

a first inverter configured to receive a signal of a common node between the second PMOS transistor and the NMOS transistor; and a second NAND gate for receiving an output of the first inverter and the reset signal and outputting the NANDed signal to the common node.

9. The ODT mode conversion circuit as recited in claim 8, wherein the flip-flop unit includes:

a first transmission gate for transmitting the output of the latch unit in response to the buffered clock signals;

a third NAND gate configured to receive an output of the first transmission gate and the reset signal;

a second inverter for inverting an output of the third NAND gate to output the inverted signal to an output node of the transmission gate; and a third inverter for inverting the output of the third NAND gate, an output of the third inverter being the feedback signal.

10. The ODT mode conversion circuit as recited in claim 3, wherein the mode classification signal generator includes:

a NOR gate configured to receive the delayed precharge power down exit signal and the active power down exit signal;

a first NAND gate configured to receive an output of the NOR gate;

a second NAND gate configured to receive the clock enable internal signal and an output of the first NAND gate, an output of the second NAND gate being inputted to the first NAND gate; and an inverter for inverting the output of the second NAND gate.

11. The ODT mode conversion circuit as recited in claim 3, wherein the ODT control unit includes:

an ODT control signal generator for receiving an ODT control clock signal, rising and falling clock signals outputted from a DLL circuit, and the mode classification signal and generating a control signal that is used in the ODT control signal generator; and an RTT formation control signal output unit for delaying an ODT comparison signal by a predetermined time in response to the ODT control signal generator and generating an RTT formation control signal.

12. The ODT mode conversion circuit as recited in claim 11, wherein the ODT control signal generator includes:
a first ODT control signal generation unit for receiving the ODT control clock signal and outputting a first delay clock signal and a first delay clock bar signal, the first delay clock signal being a signal provided by delaying the ODT control clock signal by a predetermined time;
a second ODT control signal generation unit for receiving the rising clock signal and the mode classification signal and outputting a delayed rising clock signal and a delayed rising clock bar signal; and
a third ODT control signal generation unit for receiving the falling clock signal and the mode classification signal and outputting a delayed falling clock signal and a delayed falling clock bar signal.

13. The ODT mode conversion circuit as recited in claim 12, wherein the RTT formation control signal output unit includes:
a first latch unit for latching the ODT comparison signal in response to the first delay clock signal and the first delay clock bar signal;
a second latch unit for inverting an output phase of the first latch unit in response to the first delay clock signal and the first delay clock bar signal;
a third latch unit for inverting an output phase of the second latch unit in response to the first delay clock signal and the first delay clock bar signal;
a fourth latch unit for inverting an output phase of the third latch unit in response to the delay falling clock signal and the delay falling clock bar signal;
a fifth latch unit for inverting an output phase of the fourth latch unit in response to the delay rising clock signal and the delay rising clock bar signal;
a sixth latch unit for inverting an output phase of the fifth latch unit in response to the delay falling clock signal and the delay falling clock bar signal; and
a NAND gate configured to receive the output of the fifth latch unit and an inverted output of the sixth latch unit.

14. The ODT mode conversion circuit as recited in claim 12, wherein the first ODT control signal generation unit includes:
a transmission gate for transmitting the ODT control clock signal in response to a ground voltage and a power supply voltage;
a first inverter for inverting an output of the transmission gate; and
second and third inverters connected in series to delay the ODT control clock signal.

15. The ODT mode conversion circuit as recited in claim 12, wherein the second ODT control signal generation unit includes:
a first inverter for inverting the rising clock signal;
a NAND gate configured to receive an output of the first inverter and the mode classification signal;
a transmission gate for transmitting an output of the NAND gate in response to a ground voltage and a power supply voltage;
a second inverter for inverting an output of the transmission gate; and
third and fourth inverters connected in series to delay the output of the NAND gate.

16. The ODT mode conversion circuit as recited in claim 12, wherein the third ODT control signal generation unit
a first inverter for inverting the falling clock signal;
a NAND gate configured to receive an output of the first inverter and the mode classification signal;
a transmission gate for transmitting an output of the NAND gate in response to a ground voltage and a power supply voltage;
a second inverter for inverting an output of the transmission gate; and
third and fourth inverters connected in series to delay the output of the NAND gate.

17. The ODT mode conversion circuit as recited in claim 13, wherein the first latch unit includes:
a transmission gate for transmitting the ODT comparison signal in response to the first delay clock signal and the first delay clock bar signal; and
first and second inverters connected back-to-back to latch an output of the transmission gate.

18. An ODT mode conversion circuit for use in a semiconductor memory device, comprising:
a clock enable buffering unit for buffering a clock enable signal and outputting a buffered clock enable signal;
a clock buffering unit for receiving an external clock signal and outputting an ODT control clock signal;
an ODT buffering unit for comparing an ODT signal with a reference voltage and outputting an ODT comparison signal;
a DLL circuit for outputting a rising clock signal and a falling clock signal in response to the external clock signal;
a clock enable control unit for receiving a precharge signal including an information on a presence of a bank access in a semiconductor memory device, detecting whether the semiconductor memory device exits a precharge power down mode or an active power down mode, and outputting a mode classification signal, the mode classification signal having different logic levels depending on the precharge power down exit and the active power down exit;
an ODT control unit for receiving the mode classification signal, the ODT control clock signal, the ODT comparison signal, a reset signal, the rising clock signal and the falling clock signal, and outputting an RTT formation control signal, the reset signal being a signal that initializes the ODT control unit; and
an RTT formation unit for turning on/off an RTT in response to the RTT formation control signal.

19. The ODT mode conversion circuit as recited in claim 18, wherein the clock enable control unit includes:
a power down exit detector for receiving a clock enable internal signal and the precharge signal and outputting a precharge power down exit signal or an active power down exit signal, the clock enable internal signal being an internal signal of a semiconductor memory device, which has an information on a clock enable signal inputted from an external circuit;
a clock counter for delaying the precharge power down exit signal by a predetermined time using a reset signal and a buffered clock signal, and outputting a delayed precharge power down exit signal, the reset signal being a signal that initializes the clock counter, the buffered clock signal being a buffered external clock signal; and a mode classification signal generator for logically combining the delayed precharge power down exit signal and the active power down exit signal and outputting the mode classification signal.

20. The ODT mode conversion circuit as recited in claim 19, wherein the power down exit detector includes:
a clock enable detection unit for receiving the clock enable internal signal and checking a detection of a clock enable signal; and
a decoding unit for receiving an output of the clock enable detection unit and the precharge signal and outputting the precharge power down exit signal and the active power down exit signal.

21. The ODT mode conversion circuit as recited in claim 19, wherein the clock counter includes:
a latch unit for receiving the precharge power down exit signal, the reset signal and a feedback signal, which is fed back from a flip-flop unit, and outputting a latched power down exit signal; and
a flip-flop unit for shifts the latched power down exit signal by a predetermined clock cycle and outputting the shifted power down exit signal.

22. The ODT mode conversion circuit as recited in claim 19, wherein the ODT control unit includes:
an ODT control signal generator for receiving an ODT control clock signal, rising and falling clock signals outputted from a DLL circuit, and the mode classification signal and generating a control signal that is used in the ODT control signal generator; and
an RTT formation control signal output unit for delaying an ODT comparison signal by a predetermined time in response to the ODT control signal generator and generating an RTT formation control signal.

23. The ODT mode conversion circuit as recited in claim 22, wherein the ODT control signal generator includes:
a first ODT control signal generation unit for receiving the ODT control clock signal and outputting a first delay clock signal and a first delay clock bar signal, the first delay clock signal being a signal provided by delaying the ODT control clock signal by a predetermined time;
a second ODT control signal generation unit for receiving the rising clock signal and the mode classification signal and outputting a delayed rising clock signal and a delayed rising clock bar signal; and
a third ODT control signal generation unit for receiving the falling clock signal and the mode classification signal and outputting a delayed falling clock signal and a delayed falling clock bar signal.

24. The ODT mode conversion circuit as recited in claim 23, wherein the RTT formation control signal output unit includes:
a first latch unit for latching the ODT comparison signal in response to the first delay clock signal and the first delay clock bar signal;
a second latch unit for inverting an output phase of the first latch unit in response to the first delay clock signal and the first delay clock bar signal;
a third latch unit for inverting an output phase of the second latch unit in response to the first delay clock signal and the first delay clock bar signal;
a fourth latch unit for inverting an output phase of the third latch unit in response to the delay falling clock signal and the delay falling clock bar signal;
a fifth latch unit for inverting an output phase of the fourth latch unit in response to the delay rising clock signal and the delay rising clock bar signal;
a sixth latch unit for inverting an output phase of the fifth latch unit in response to the delay falling clock signal and the delay falling clock bar signal; and
a NAND gate configured to receive the output of the fifth latch unit and an inverted output of the sixth latch unit.

25. An ODT mode conversion method, comprising the steps of:
a) receiving a precharge signal to detect whether a semiconductor memory device exits a precharge power down mode or an active power down mode, and outputting a mode classification signal, the mode classification signal having different logic levels depending on the precharge power down exit and the active power down exit;
b) outputting an RTT formation control signal while an operation is in a power down mode or an active/standby mode according to the mode classification signal; and
c) forming an RTT according to an RTT formation control signal.

26. The ODT mode conversion method as recited in claim 25, wherein the step a) includes the steps of:
d) receiving a clock enable internal signal and the precharge signal and outputting a precharge power down exit signal or an active power down exit signal, the clock enable internal signal being an internal signal of a semiconductor memory device, which has an information on a clock enable signal inputted from an external circuit;
e) delaying the precharge power down exit signal by a predetermined time using a reset signal and a buffered clock signal, and outputting a delayed precharge power down exit signal, the reset signal being a signal that initializes the clock counter, the buffered clock signal being a buffered external clock signal; and
f) logically combining the delayed precharge power down exit signal and the active power down exit signal and outputting the mode classification signal.

27. The ODT mode conversion method as recited in claim 26, wherein the step d) includes the steps of:
g) receiving the clock enable internal signal and checking a detection of a clock enable signal; and
h) receiving an output signal of the step g) and the precharge signal and outputting the precharge power down exit signal and the active power down exit signal.

28. The ODT mode conversion method as recited in claim 26, wherein the step b) includes the steps of:
g) receiving an ODT control clock signal, rising and falling clock signals outputted from a DLL circuit, and the mode classification signal and generating a control signal that is used in an ODT control signal generator; and
h) delaying an ODT comparison signal by a predetermined time in response to the output of the step g) and generating an RTT formation control signal.

* * * * *